(12) United States Patent
Goto

(10) Patent No.: US 9,905,446 B2
(45) Date of Patent: Feb. 27, 2018

(54) SUBSTRATE TRANSFERRING APPARATUS

(71) Applicant: KAWASAKI JUKOGYO KABUSHIKI KAISHA, Kobe-shi, Hyogo (JP)

(72) Inventor: Hirohiko Goto, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 15/034,978

(22) PCT Filed: Nov. 6, 2013

(86) PCT No.: PCT/JP2013/006541
§ 371 (c)(1),
(2) Date: May 6, 2016

(87) PCT Pub. No.: WO2015/068185
PCT Pub. Date: May 14, 2015

(65) Prior Publication Data
US 2016/0293466 A1    Oct. 6, 2016

(51) Int. Cl.
  *H01L 21/67* (2006.01)
  *H01L 21/677* (2006.01)
  *B25J 9/04* (2006.01)
(52) U.S. Cl.
  CPC ........ *H01L 21/67742* (2013.01); *B25J 9/043* (2013.01); *H01L 21/67167* (2013.01)
(58) Field of Classification Search
  CPC ........ H01L 21/676167; H01L 21/67742; B25J 9/042; B25J 9/043
  (Continued)

(56) References Cited

U.S. PATENT DOCUMENTS

2004/0216475 A1    11/2004 Sasaki et al.
2005/0217053 A1*   10/2005 Kim .................. B25J 9/0084
                                                         15/250.21
(Continued)

FOREIGN PATENT DOCUMENTS

JP    2000-072248 A    3/2000
JP    2003-089088 A    3/2003
(Continued)

OTHER PUBLICATIONS

Jan. 21, 2014 International Preliminary Report on Patentability issued in International Patent Application No. PCT/JP2013/006541.
(Continued)

*Primary Examiner* — Anna M Momper
*Assistant Examiner* — Ronald P Jarrett
(74) *Attorney, Agent, or Firm* — Oliff PLC

(57) ABSTRACT

Substrate transferring apparatus includes a first-hand mechanism and second hand mechanism. The first-hand mechanism includes a first lower arm, first upper arm, first-hand having a tip end portion as a first substrate holding portion, and first driven mechanism to rotate the first-hand with rotation of the first upper arm. The first-hand mechanism so the first substrate holding portion movable by rotations of the first lower arm, first upper arm, and first-hand between a contracted and extended positions. The second-hand mechanism includes a second lower arm, second upper arm, second-hand having a tip end portion as a second substrate holding portion, and second driven mechanism to rotate the second-hand with rotation of the second upper arm. The second-hand mechanism so the second substrate holding portion movable by rotations of the second lower arm, second upper arm, and second-hand in sync with the first substrate holding portion between a contracted and extended positions.

7 Claims, 19 Drawing Sheets

(58) Field of Classification Search
USPC .................................... 414/744.6; 74/490.01
See application file for complete search history.

(56) References Cited

U.S. PATENT DOCUMENTS

| | | | | |
|---|---|---|---|---|
| 2010/0178147 A1* | 7/2010 | Kremerman | ............. | B25J 9/042 414/744.5 |
| 2011/0293395 A1* | 12/2011 | Goto | ........................ | B25J 9/043 414/744.5 |

FOREIGN PATENT DOCUMENTS

| | | |
|---|---|---|
| JP | 2004-288718 A | 10/2004 |
| JP | 2011-161554 A | 8/2011 |
| JP | 2012-514569 A | 6/2012 |

OTHER PUBLICATIONS

Jan. 21, 2014 International Search Report issued International Patent Application No. PCT/JP2013/006541.

* cited by examiner

SUBSTRATE TRANSFERRING APPARATUS

TECHNICAL FIELD

The present invention relates to a substrate transferring apparatus configured to transfer substrates such as silicon wafers or glass wafers, and particularly to a substrate transferring apparatus including two hands configured to transfer substrates.

BACKGROUND ART

A multi-chamber system that is semiconductor processing equipment has been known. The multi-chamber system includes a plurality of semiconductor processing rooms and a load lock room. Each of the semiconductor processing rooms and the load lock room is connected to one transferring room through a gate, and a transferring apparatus is arranged in the transferring room. The transferring apparatus takes wafers from the load lock room and the semiconductor processing room, transfers the wafers to predetermined substrate placing positions of the next semiconductor processing rooms, and places the substrates at the substrate placing positions. The semiconductor wafers transferred to the substrate placing positions are subjected to a predetermined process treatment and then further transferred by the transferring apparatus to the next substrate placing positions. As the transferring apparatus, a transferring apparatus including two hands disclosed in PTL 1 is known, for example.

The transferring apparatus of PTL 1 includes a turning link and two hand mechanisms. The turning link is rotated by a revolution drive mechanism. Arms of the hand mechanisms are attached to the turning link so as to be rotatable. Hands of the hand mechanisms are attached to the respective arms of the hand mechanisms so as to be rotatable. The arms of the two hand mechanisms are connected to corresponding hand drive mechanisms through corresponding arm belts and the like. Each of the hand drive mechanisms is configured to move the arm belt to rotate the arm. The hands of the hand mechanisms are connected to the corresponding arms of the hand mechanisms through corresponding interlock mechanisms. Each of the interlock mechanisms is configured to operate in accordance with the rotation of the arm of the hand mechanism to rotate the hand. Each of the hands of the hand mechanisms is configured to be able to hold the wafer.

According to the transferring apparatus configured as above, while rotating the turning link by the revolution drive mechanism, one of the hand drive mechanisms rotates the hand mechanism corresponding to this hand drive mechanism such that the hand of the hand mechanism faces in a direction that substantially coincides with an opening direction of the gate. Thus, the transferring apparatus transfers the wafer held by the hand. With this, the wafer and the arm of the hand mechanism can be prevented from contacting the gate.

CITATION LIST

Patent Literature

PTL 1: Japanese Laid-Open Patent Application Publication No. 2011-161554

SUMMARY OF INVENTION

Technical Problem

According to the transferring apparatus described in PTL 1, while performing extension of one of the hand mechanisms, the turning link is rotated by the revolution drive mechanism such that the hand of the above hand mechanism faces in the direction that substantially coincides with the opening direction of the gate. Therefore, the turning link cannot be rotated by the revolution drive mechanism such that the hand of the other hand mechanism face in a direction that substantially coincides with the opening direction of the gate. Thus, a problem is that a substrate transfer efficiency is low. It should be noted that this type of problem occurs not only regarding the semiconductor wafers but also regarding substrates processed by a substrate processing system having a similar structure to the multi-chamber system.

Solution to Problem

To solve the above problem, a substrate transferring apparatus according to the present invention includes: a turning portion configured to be rotatable around a turning axis; a first hand mechanism and a second hand mechanism provided at the turning portion so as to be symmetrical with respect to a symmetric surface including the turning axis; and a transferring apparatus drive mechanism configured to drive the first and second hand mechanisms, wherein: the first hand mechanism includes a first lower arm having one end portion attached to the turning portion so as to be rotatable around a first axis parallel to the turning axis, a first upper arm having one end portion attached to the other end portion of the first lower arm so as to be rotatable around a second axis parallel to the turning axis, a first hand having a tip end portion as a first substrate holding portion and having a base end portion attached to the other end portion of the first upper arm so as to be rotatable around a third axis parallel to the turning axis, the first hand being configured to rotate in accordance with the rotation of the first upper arm, and a first driven mechanism configured to rotate the first hand in accordance with the rotation of the first upper arm; the first hand mechanism is configured such that the first substrate holding portion is movable by the rotations of the first lower arm, the first upper arm, and the first hand between a contracted position close to the turning axis and an extended position farther from the turning axis than the contracted position; the second hand mechanism includes a second lower arm having one end portion attached to the turning portion so as to be rotatable around a fourth axis parallel to the turning axis, a second upper arm having one end portion attached to the other end portion of the second lower arm so as to be rotatable around a fifth axis parallel to the turning axis, a second hand having a tip end portion as a second substrate holding portion and having a base end portion attached to the other end portion of the second upper arm so as to be rotatable around a sixth axis parallel to the turning axis, the second hand being configured to rotate in accordance with the rotation of the second upper arm, and a second driven mechanism configured to rotate the second hand in accordance with the rotation of the second upper arm; and the second hand mechanism is configured such that the second substrate holding portion is movable by the rotations of the second lower arm, the second upper arm, and the second hand in sync with the first substrate holding portion between a contracted position close to the turning axis and an extended position farther from the turning axis than the contracted position.

According to this configuration, the first hand mechanism and the second hand mechanism can be driven at the same time to transfer the substrates. Therefore, the substrate transfer efficiency can be improved. In addition, this improvement can be realized by three shafts.

Further, the substrate transferring apparatus of the present invention is applicable to semiconductor processing equipment in which processing rooms where the same treatment is performed are provided at one of two virtual regions obtained by dividing the semiconductor processing equipment such that center angles of the two virtual regions when viewed from an extending direction of the turning axis are equal to each other.

The substrate transferring apparatus may be configured such that: the first substrate holding portion is configured to operate such that a substrate held by the first substrate holding portion is moved in a region located at one side of the symmetric surface; and the second substrate holding portion is configured to operate such that a substrate held by the second substrate holding portion is moved in a region located at the other side of the symmetric surface.

According to this configuration, the substrate held by the first substrate holding portion and the substrate held by the second substrate holding portion can be prevented from interfering with each other.

The substrate transferring apparatus may be configured such that the transferring apparatus drive mechanism includes: a first driving portion configured to rotate the turning portion; a second driving portion configured to rotate the first lower arm and the second lower arm in conjunction with each other in directions opposite to each other; and a third driving portion configured to rotate the first upper arm and the second upper arm in conjunction with each other in directions opposite to each other.

According to this configuration, the configuration of the substrate transferring apparatus 1 can be simplified, and this is advantageous in manufacture and makes the manufacturing cost low.

The substrate transferring apparatus may be configured such that: the first driven mechanism rotates the first hand in accordance with the rotation of the first upper arm at a reduction ratio of not lower than 1.35 and not higher than 1.65; and the second driven mechanism rotates the second hand in accordance with the rotation of the second upper arm at a reduction ratio of not lower than 1.35 and not higher than 1.65.

According to this configuration, the hand of one of the first and second hand mechanisms can be rotated in accordance with the rotation of the upper arm so as to avoid the other hand mechanism.

The substrate transferring apparatus may be configured such that: the first hand at the contracted position takes such a posture as to get away from the symmetric surface as the first hand extends from the third axis toward a center of the first substrate holding portion; and the second hand at the contracted position takes such a posture as to get away from the symmetric surface as the second hand extends from the sixth axis toward a center of the second substrate holding portion.

According to this configuration, the substrate held by one of the first and second substrate holding portions of the substrate transferring apparatus in the initial posture can be prevented from interfering with the substrate held by the other substrate holding portion.

The substrate transferring apparatus may be configured such that each of the first and second substrate holding portions is configured to move from the contracted position to the extended position such that a trajectory of each of the first and second substrate holding portions becomes a curved line that practically gets close to a straight line extending radially from the turning axis or a straight line parallel to the straight line extending radially from the turning axis.

According to this configuration, in the vicinity of the extended position, each of the first and second substrate holding portions can be moved so as to draw a substantially straight line. Therefore, the first and second substrate holding portions can be easily inserted into the respective substrate processing rooms.

Advantageous Effects of Invention

The present invention can improve the transfer efficiency of the substrate transferring apparatus.

DESCRIPTION OF EMBODIMENTS

Hereinafter, an embodiment of the present invention will be explained in reference to the drawings.

Semiconductor Processing Equipment

Figure 1:
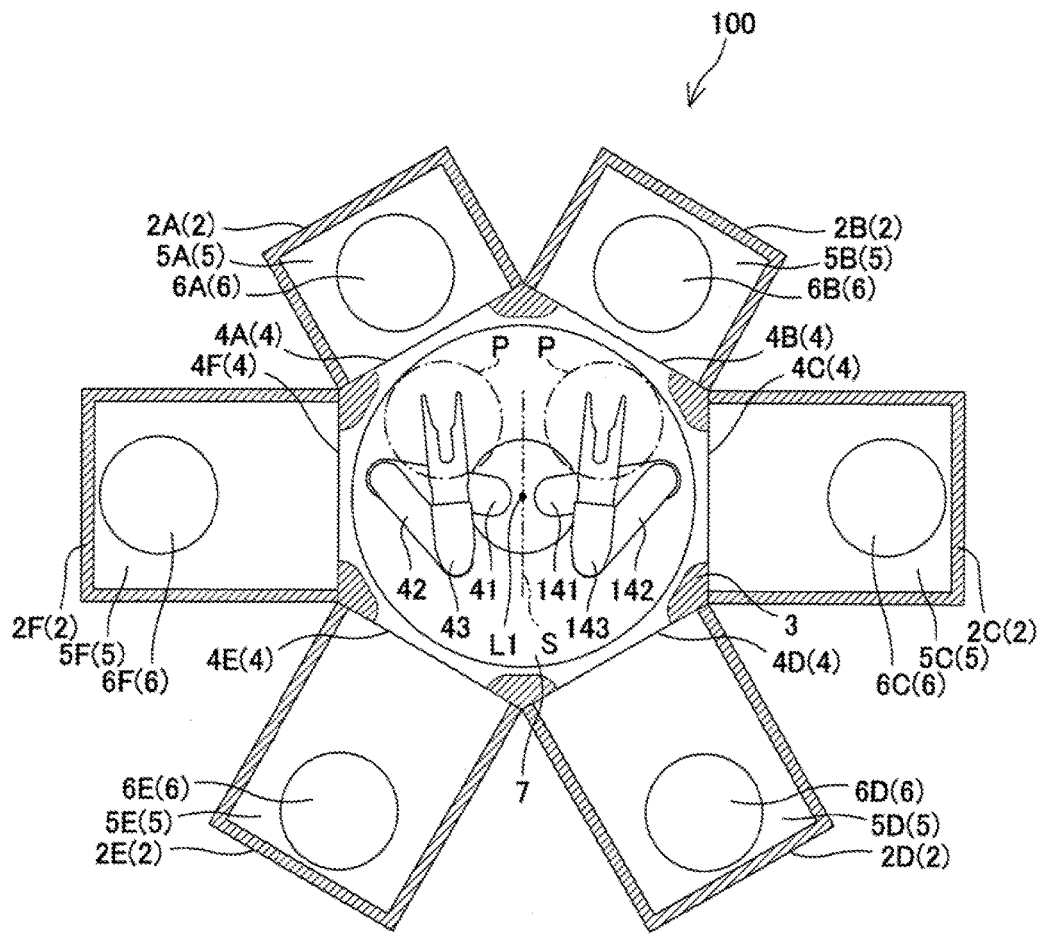
FIG. 1 is a plan view showing a configuration example of semiconductor processing equipment including a substrate transferring apparatus according to an embodiment of the present invention.

FIG. 1 is a plan view showing a configuration example of semiconductor processing equipment 100 including a substrate transferring apparatus 1 according to the embodiment of the present invention. The semiconductor processing equipment 100 is one example of a substrate processing system. The substrate processing system may be a system in which: a plurality of processing rooms where substrates are processed are provided around a transferring space; and a transferring apparatus configured to insert the substrate into or take out the substrate from each of the processing rooms is provided in the transferring space. As shown in FIG. 1, the semiconductor processing equipment 100 is equipment configured to subject substrates P to various process treatments, such as a heat treatment, an impurity introducing treatment, a thin film forming treatment, a lithography treatment, a washing treatment, and a flattening treatment. In the present invention, the substrates P are semiconductor wafers, glass wafers, or the like. Examples of the semiconductor wafers include silicon wafers, sapphire (single-crystal alumina) wafers, and the other various wafers. Examples of the glass wafers include FPD (Flat Panel Display) glass substrates and MEMS (Micro Electro Mechanical Systems) glass substrates.

In addition to the substrate transferring apparatus 1, the semiconductor processing equipment 100 further includes a plurality of chambers 2, a transferring chamber 3, and gates 4.

The plurality of chambers 2 include respective rooms 5. Examples of the rooms 5 include: a processing room (load lock room) through which the substrate P to be processed is inserted into the semiconductor processing equipment 100 or the processed substrate P is taken out from the semiconductor processing equipment 100; and a processing room in which the substrate P is subjected to various process treatments. A substrate placing position 6 where the substrate P is placed when the substrate P is subjected to various process treatments or when the substrate P stands by is predetermined in each of the rooms 5. The load lock room includes an opening and gate (not shown) through which the substrate P is taken out to or is inserted from an outside of the semiconductor processing equipment 100. The substrate placing positions 6 of the plurality of chambers 2 are provided radially relative to a turning axis L1 of the below-described substrate transferring apparatus 1. Substrate supporting portions (not shown) are provided at the respective substrate placing positions 6.

An outer shape of the transferring chamber 3 is a polygonal shape in a plan view, and the number of sides of the outer shape of the transferring chamber 3 is equal to or more than the number of chambers 2 included in the semiconductor processing equipment 100. The chambers 2 are provided so as to be adjacent to the respective sides of the outer shape of the transferring chamber 3. The transferring chamber 3 includes a transferring room 7 where the substrate transferring apparatus 1 is provided. The transferring room 7 is formed in a substantially circular shape (or a regular polygonal shape) in a plan view. An inner diameter of the transferring room 7 is slightly larger than a revolution radius (details will be described later) of the substrate transferring apparatus 1 in an initial posture. Thus, the turning substrate transferring apparatus 1 in the initial posture is prevented from interfering with an inner wall of the transferring room 7.

Each of the gates 4 is provided at a boundary between the room 5 and the transferring room 7 and is open in a direction in which a straight line extending radially from the turning axis L1 of the below-described substrate transferring apparatus 1 extends or a straight line parallel to the above straight line extending radially from the turning axis L1 extends. The rooms 5 are accessible from the transferring room 7 through the gates 4. In a plan view, each of the substrate placing positions 6 of the chambers 2 is positioned on a straight line extending from the gate 4 in a depth direction of the room 5. With this, the substrate P can be linearly inserted through the gate 4 to be positioned at the substrate placing position 6.

The substrate transferring apparatus 1 is configured to be able to transfer the substrates P to the substrate placing positions 6 and take out the substrates P from the substrate placing positions 6.

In the present embodiment, the semiconductor processing equipment 100 includes, for example, six chambers 2A to 2F having six rooms 5A to 5F, respectively. The rooms 5A and 5B of the adjacent chambers 2A and 2B are processing rooms where a first treatment is performed. The rooms 5C and 5D of the adjacent chambers 2C and 2D are processing rooms where a second treatment is performed. The rooms 5E and 5F of the adjacent chambers 2E and 2F are processing rooms where a third treatment is performed. As above, the processing rooms where the same treatment is performed are provided at one of two virtual regions obtained by dividing the semiconductor processing equipment 100 such that center angles of the two virtual regions when viewed from an extending direction of the below-described turning axis L1 are equal to each other. In a case where the rooms 5A and 5B of the chambers 2A and 2B provided at the same virtual region are set as the load lock rooms through each of which the substrate P to be processed is inserted into the semiconductor processing equipment 100 or the processed substrate P is taken out from the semiconductor processing equipment 100, a substrate transferring apparatus configured to take out the substrate P from the load lock room to the outside and insert the substrate P into the load lock room from the outside can be made simpler than a substrate transferring apparatus used in a case where, for example, the load lock rooms are provided on a diagonal line.

The six rooms 5A to 5F include substrate placing positions 6A to 6F, respectively. The transferring room 7 is formed in a substantially hexagonal shape in a plan view and is connected to the six rooms 5A to 5F through gates 4A to 4F.

Entire Configuration of Substrate Transferring Apparatus

Figure 2:
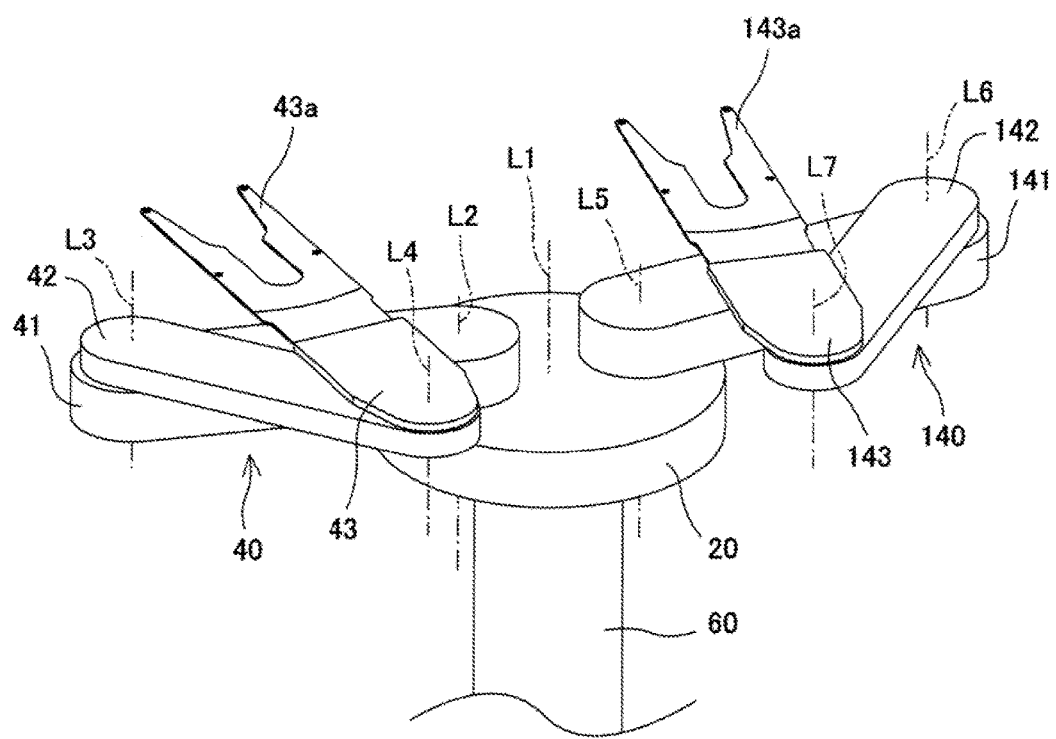
FIG. 2 is a perspective view showing the substrate transferring apparatus of FIG. 1 when viewed obliquely from above.
Figure 3:
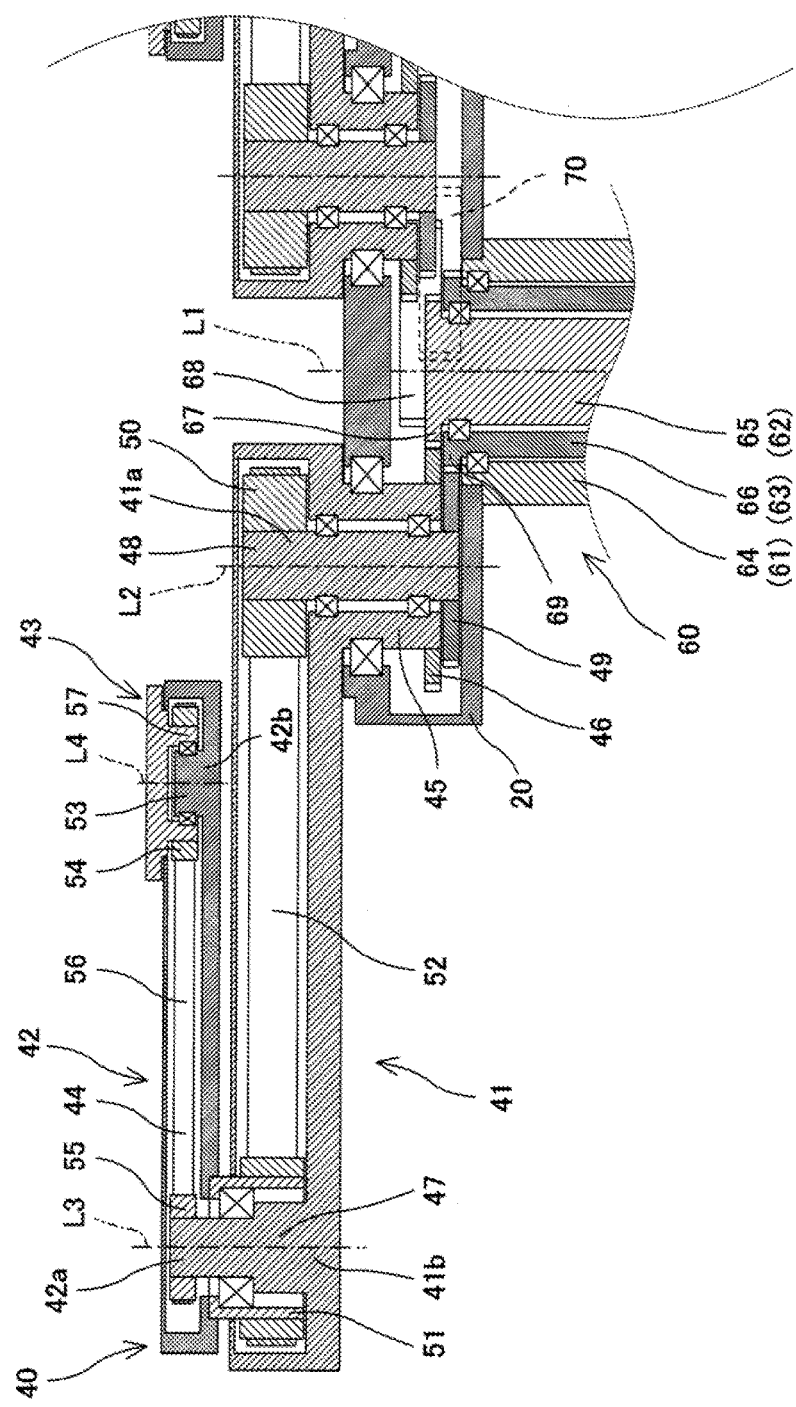
FIG. 3 is an enlarged cross-sectional view showing a cross section of a first hand mechanism of the substrate transferring apparatus of FIG. 1 and cross sections of portions around the first hand mechanism, the cross sections being obtained by vertically cutting the first hand mechanism and the portions around the first hand mechanism.
Figure 4:
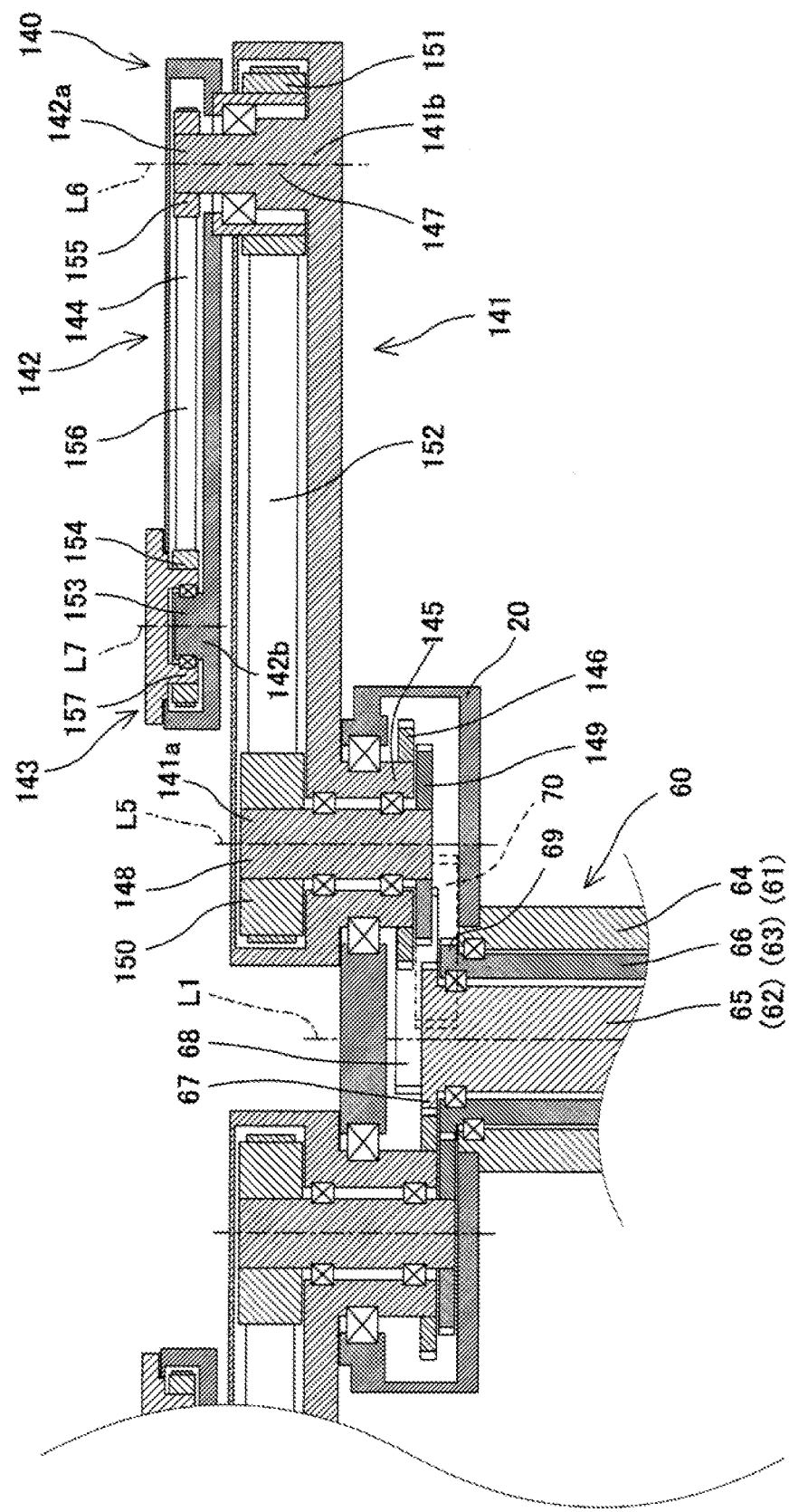
FIG. 4 is an enlarged cross-sectional view showing a cross section of a second hand mechanism of the substrate transferring apparatus of FIG. 1 and cross sections of portions around the second hand mechanism, the cross sections being obtained by vertically cutting the second hand mechanism and the portions around the second hand mechanism.

FIG. 2 is a perspective view showing the substrate transferring apparatus 1 when viewed obliquely from above. FIG. 3 is an enlarged cross-sectional view showing a cross section of a first hand mechanism 40 of the substrate transferring apparatus 1 and cross sections of portions around the first hand mechanism 40, the cross sections being obtained by vertically cutting the first hand mechanism 40 and the portions around the first hand mechanism 40. FIG. 4 is an enlarged cross-sectional view showing a cross section of a second hand mechanism 140 of the substrate transferring apparatus 1 and cross sections of portions around the second hand mechanism 140, the cross sections being obtained by vertically cutting the second hand mechanism 140 and the portions around the second hand mechanism 140.

As shown in FIGS. 2 to 4, the substrate transferring apparatus 1 includes a turning portion 20, the first hand mechanism 40, the second hand mechanism 140, a transferring apparatus drive mechanism 60, and a controller configured to control the operation of the substrate transferring apparatus 1. Further, the substrate transferring apparatus 1 includes a supporting body configured to position respective components of the substrate transferring apparatus 1 so as to realize a relation of predetermined positions. The predetermined positions denote positions appropriate for execution of a substrate transferring operation of the substrate transferring apparatus 1 of the present invention.

Turning Portion

The turning portion 20 is constituted by, for example, a hollow cylindrical member. The turning portion 20 is fixed to an upper end of a below-described turning shaft 64 such that a central axis of the turning portion 20 coincides with the turning axis L1 extending in an upward/downward direction. The turning portion 20 turns around the turning axis L1 by the rotation of the turning shaft 64.

As shown in FIG. 1, the first hand mechanism 40 and the second hand mechanism 140 are provided at the turning portion 20 so as to be symmetrical with respect to a symmetric surface S including the turning axis L1.

First Hand Mechanism

As shown in FIGS. 2 and 3, the first hand mechanism 40 includes a first lower arm 41, a first upper arm 42, a first hand 43, and a first driven mechanism 44.

The first lower arm 41 is, for example, a hollow plate-shaped member and is formed in a substantially strip shape in a plan view. As shown in FIG. 3, a first lower arm rotating shaft 45 is formed so as to project downward from a bottom surface of a turning portion-side end portion 41a of the first lower arm 41 (i.e., one end portion of the first lower arm 41). The first lower arm rotating shaft 45 is attached to the turning portion 20 so as to be rotatable around a first axis L2 extending parallel to the turning axis L1. The first lower arm rotating shaft 45 is formed in a hollow cylindrical shape, and an internal space thereof communicates with an internal space of a main body portion of the turning portion 20 and an internal space of the first lower arm 41. A first lower arm rotation driven gear 46 is fixed to a lower end portion of the first lower arm rotating shaft 45. The first lower arm rotation driven gear 46 is provided at a position that is the same in height as a position at which a lower arm rotation main gear 67 of a below-described lower arm driving shaft 65 is provided. The first lower arm rotation driven gear 46 meshes with the lower arm rotation main gear 67. A first upper arm support shaft 47 extending upward is formed at an upper arm-side end portion 41b in the first lower arm 41 (i.e., the other end portion of the first lower arm 41). The first upper arm support shaft 47 is provided such that an axis thereof coincides with a second axis L3 extending parallel to the turning axis L1. A first fixed pulley 55 is fixed to an upper end portion of the first upper arm support shaft 47.

A first upper arm rotation shaft 48 is provided inside the first lower arm rotating shaft 45. The first upper arm rotation shaft 48 is attached to the first lower arm rotating shaft 45 so as to be rotatable around the first axis L2. A lower end portion of the first upper arm rotation shaft 48 projects downward beyond a lower end of the first lower arm rotating shaft 45, and a first upper arm rotation driven gear 49 is fixed to this projecting portion of the first upper arm rotation shaft 48. The first upper arm rotation driven gear 49 is provided at a position that is the same in height as a position at which an upper arm/hand driving main gear 69 of a below-described upper arm/hand driving shaft 66 is provided. The first upper arm rotation driven gear 49 meshes with the upper arm/hand driving main gear 69. An upper end portion of the first upper arm rotation shaft 48 is located in the internal space of the first lower arm 41, and a first upper arm rotation intermediate pulley 50 is fixed to this portion of the first upper arm rotation shaft 48. The first upper arm rotation driven gear 49 and the first upper arm rotation intermediate pulley 50 are provided such that axes thereof coincide with the first axis L2.

Figure 6:
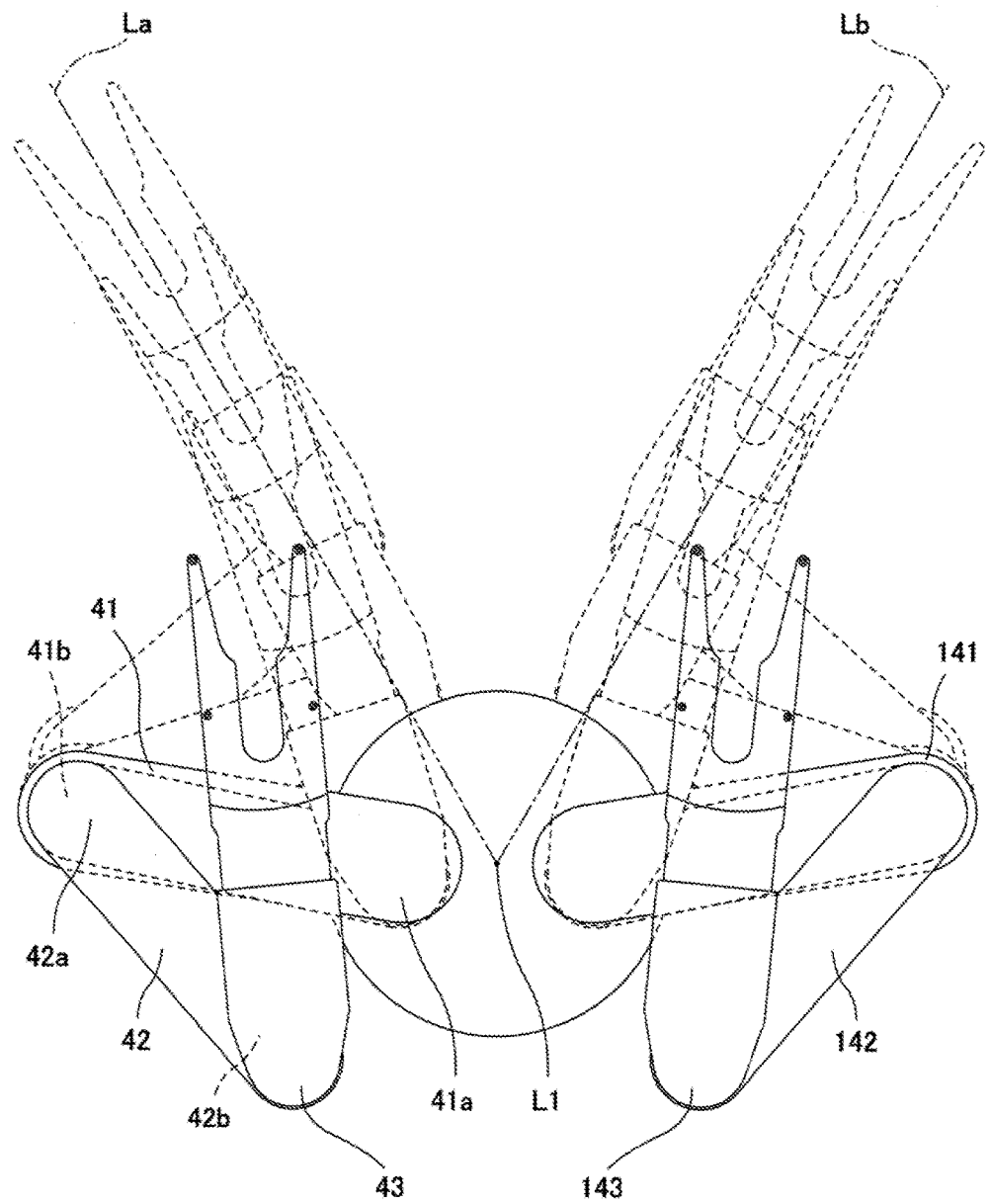
FIG. 6 is a plan view showing operations of the first and second hand mechanisms.
Figure 7:
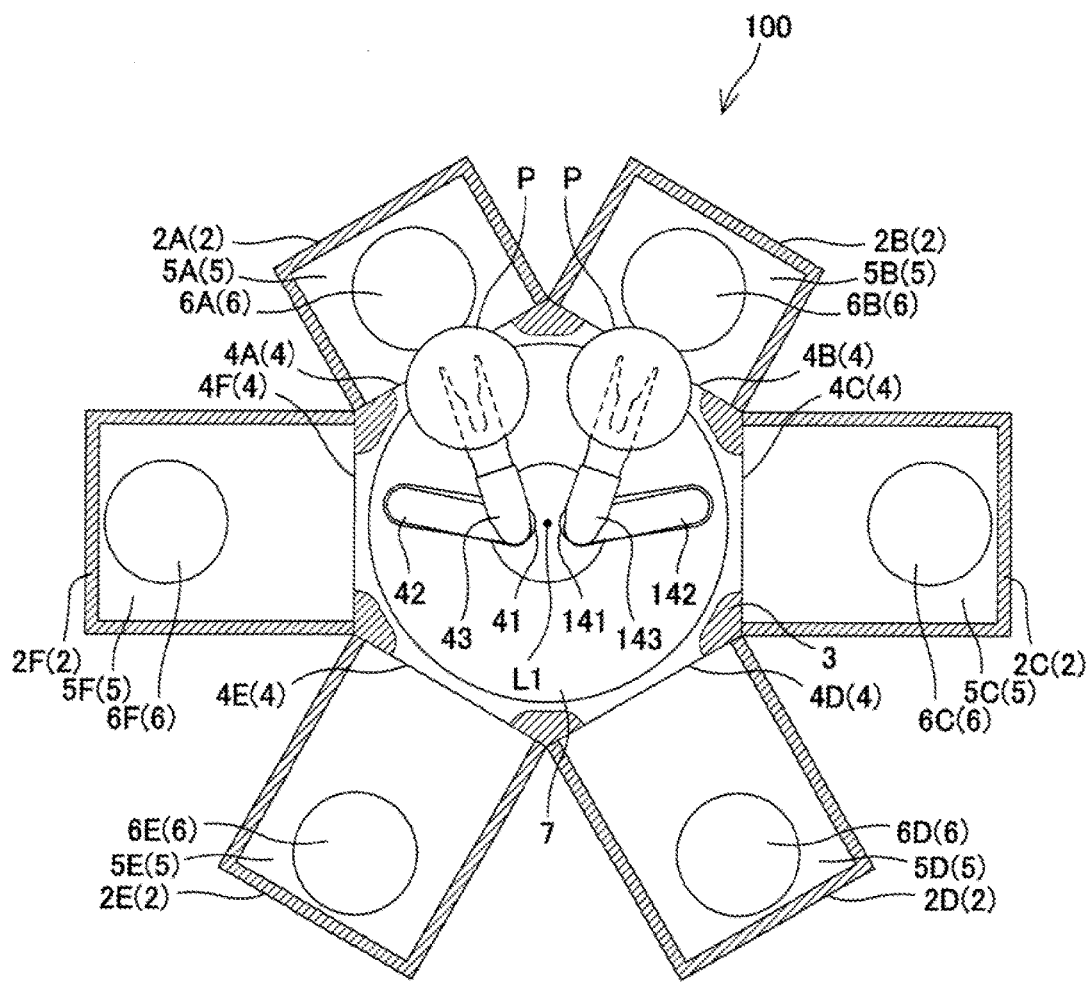
FIG. 7 is a plan view showing the substrate transferring apparatus in which the first and second hand mechanisms are extended from a state shown in FIG. 1, and therefore, hands get close to gates.
Figure 8:
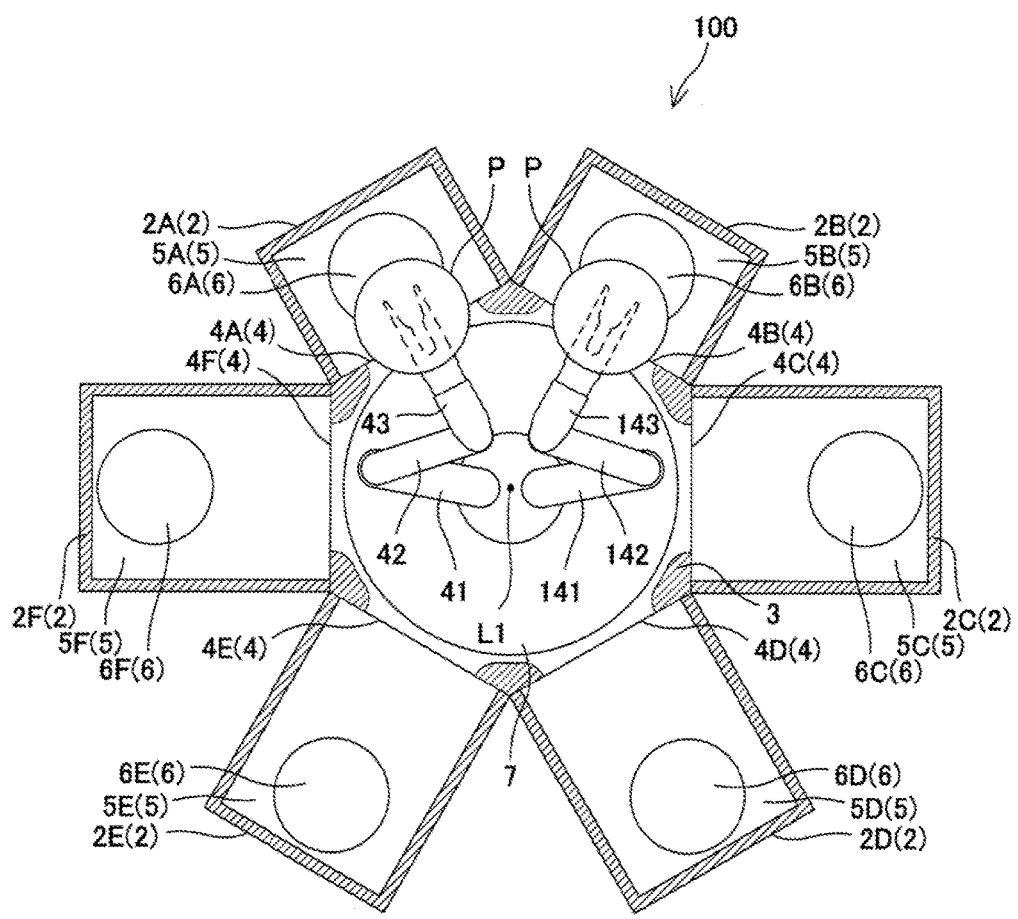
FIG. 8 is a plan view showing the substrate transferring apparatus in which the first and second hand mechanisms are further extended from a state shown in FIG. 7, and therefore, the hands are inserted into rooms of chambers.
Figure 9:
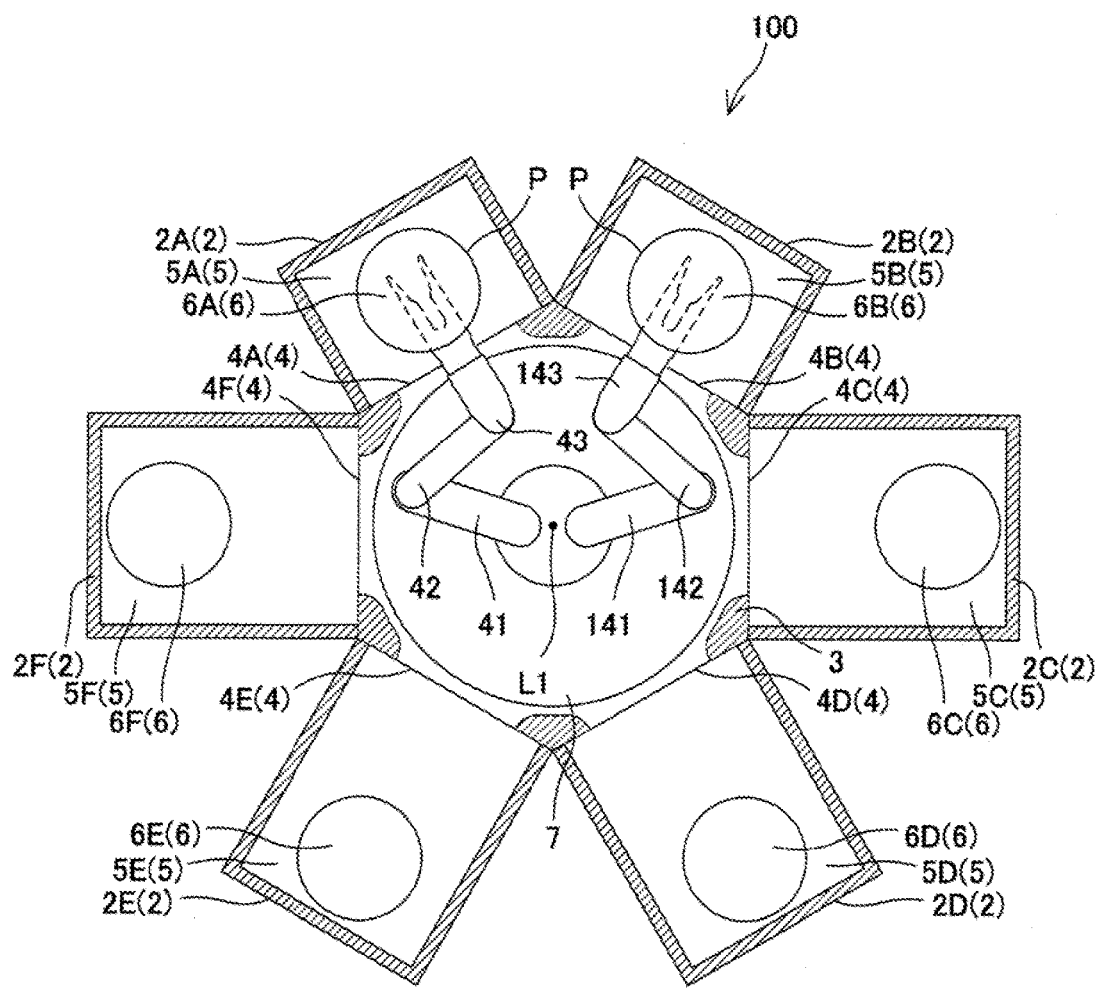
FIG. 9 is a plan view showing the substrate transferring apparatus in which the first and second hand mechanisms are further extended from a state shown in FIG. 8, and therefore, the hands are moved to substrate placing positions.

The first lower arm 41 is configured such that the initial posture thereof becomes, for example, a posture shown in FIG. 1 (also see solid lines in FIG. 6). To be specific, the first lower arm 41 extends radially from the turning portion 20.

The first upper arm 42 is, for example, a hollow plate-shaped member and is formed in a substantially strip shape in a plan view. A first upper arm rotation driven pulley 51 having a cylindrical shape is fixed to a bottom surface of a lower arm-side end portion 42a of the first upper arm 42 (i.e., one end portion of the first upper arm 42). A first transmission belt 52 winds around the first upper arm rotation intermediate pulley 50 and the first upper arm rotation driven pulley 51. The first upper arm rotation driven pulley 51 is attached to the first upper arm support shaft 47 of the first lower arm 41 so as to be rotatable. The first upper arm 42 attached to the first lower arm 41 as above is configured to be rotatable around the second axis L3. A first hand support shaft 53 extending upward is formed at a hand-side end portion 42b in the first upper arm 42 (i.e., the other end portion of the first upper arm 42). The first hand support shaft 53 is provided such that an axis thereof coincides with a third axis L4 extending parallel to the turning axis L1.

The first upper arm 42 is configured such that the initial posture thereof becomes, for example, a posture shown in FIG. 1 (also see solid lines in FIG. 6). To be specific, the first upper arm 42 extends from the upper arm-side end portion 41b of the first lower arm 41 toward the symmetric surface S.

The first hand 43 is, for example, a plate-shaped member, and a first hand rotation shaft 57 is provided at a base end portion of the first hand 43. The first hand rotation shaft 57 is formed in a cylindrical shape and is fitted and attached to the first hand support shaft 53 so as to be rotatable around the third axis L4 and located outside the first hand support shaft 53. A first hand pulley 54 is fitted and fixed to an outer periphery of the first hand rotation shaft 57. A second transmission belt 56 winds around the first hand pulley 54 and the first fixed pulley 55. As shown in FIG. 2, the first hand 43 is formed in a bifurcated shape and includes a first substrate holding portion 43a at a tip end portion thereof. The first substrate holding portion 43a is configured to be able to receive and hold the substrate P. The first substrate holding portion 43a is located on a horizontal surface that is the same as a horizontal surface on which a below-described second substrate holding portion 143a is located. Hereinafter, a direction in which the first substrate holding portion 43a and the below-described second substrate holding portion 143a face is referred to as "front", and an opposite direction thereof is referred to as "rear". The first hand 43 attached to the first upper arm 42 as above is configured to be rotatable around the third axis L4.

The first hand 43 in the initial posture extends away from the symmetric surface S as it extends from the third axis L4 toward a center of the first substrate holding portion 43a. With this, the substrate P held by the first substrate holding portion 43a can be prevented from interfering with the substrate P held by the below-described second substrate holding portion 143a and located on the same horizontal surface. A position of the first substrate holding portion 43a of the first hand 43 in the initial posture is a contracted position. By the operation of the first hand mechanism 40 described later in detail, the first substrate holding portion 43a is movable between the contracted position and an extended position located father from the turning axis L1 than the contracted position. The extended position is set so as to correspond to each of the substrate placing positions 6 of the semiconductor processing equipment 100.

The first driven mechanism 44 is a mechanism configured to be driven by the rotation of the first upper arm 42 to rotate the first hand 43. In the present embodiment, the first driven mechanism 44 is constituted by, for example, the first hand pulley 54, the first fixed pulley 55, and the second transmission belt 56 that winds around the first hand pulley 54 and the first fixed pulley 55. The first fixed pulley 55 is fixed to the first upper arm support shaft 47 such that an axis thereof coincides with the second axis L3. Therefore, when the first hand support shaft 53 revolves around the second axis L3 by the rotation of the first upper arm 42, the first hand rotation shaft 57 attached to the first hand support shaft 53 so as to be rotatable rotates around the third axis L4 in a direction opposite to the rotational direction of the first upper arm 42, and the first hand 43 rotates around the third axis L4 in a direction opposite to the rotational direction of the first upper arm 42. Therefore, when the first upper arm 42 rotates such that the hand-side end portion 42b of the first upper arm 42 in the initial posture moves forward, the first hand 43 rotates accordingly such that an angle between the first upper arm 42 and the first hand 43 at the third axis L4 increases (i.e., the first upper arm 42 and the first hand 43 extend). On the other hand, when the first upper arm 42 rotates such that the hand-side end portion 42b of the first upper arm 42 moves rearward, the first hand 43 rotates accordingly such that the angle between the first upper arm 42 and the first hand 43 at the third axis L4 decreases (i.e., the first upper arm 42 and the first hand 43 contract).

The first hand 43 rotates in accordance with the rotation of the first upper arm 42 so as to avoid the second hand mechanism 140. In the present embodiment, this operation is realized by adjusting a change gear ratio between the first hand pulley 54 and the first fixed pulley 55, that is, a reduction ratio of the first hand 43 to the first upper arm 42. The reduction ratio is set within a range of not lower than 1.35 and not higher than 1.65. By setting the reduction ratio in such range, the first hand 43 rotates in accordance with the rotation of the first upper arm 42 so as to avoid the second hand mechanism 140. By cooperation with the rotational operation of the first lower arm 41, the first substrate holding portion 43a can be moved such that a movement trajectory of the first substrate holding portion 43a becomes a predetermined curved line that practically gets close to a straight line extending radially from the turning axis L1 or a straight line parallel to the above straight line extending radially from the turning axis L1 (details will be described later). In the present embodiment, the reduction ratio is set to 1.57.

Second Hand Mechanism

As shown in FIGS. 2 and 4, the second hand mechanism 140 includes a second lower arm 141, a second upper arm 142, a second hand 143, and a second driven mechanism 144.

The second lower arm 141 is, for example, a hollow plate-shaped member and is formed in a substantially strip shape in a plan view. As shown in FIG. 4, a second lower arm rotating shaft 145 is formed so as to project downward from a bottom surface of a turning portion-side end portion 141a of the second lower arm 141 (i.e., one end portion of the second lower arm 141). The second lower arm rotating shaft 145 is attached to the turning portion 20 so as to be rotatable around a fourth axis L5 extending parallel to the turning axis L1. The second lower arm rotating shaft 145 is formed in a hollow cylindrical shape, and an internal space thereof communicates with the internal space of the main body portion of the turning portion 20 and an internal space of the second lower arm 141. A second lower arm rotation driven gear 146 is fixed to a lower end portion of the second lower arm rotating shaft 145. The second lower arm rotation driven gear 146 is provided at a position higher than a position at which the lower arm rotation main gear 67 of the below-described lower arm driving shaft 65 is provided. The second lower arm rotation driven gear 146 is connected to the lower arm rotation main gear 67 through a first reversing gear 68. With this, the rotation of the lower arm rotation main gear 67 is transmitted to the second lower arm rotation driven gear 146 through the first reversing gear 68. A second upper arm support shaft 147 extending upward is formed at an upper arm-side end portion 141b in the second lower arm 141 (i.e., the other end portion of the second lower arm 141). The second upper arm support shaft 147 is provided such that an axis thereof coincides with a fifth axis L6 extending parallel to the turning axis L1. A second fixed pulley 155 is fixed to an upper end portion of the second upper arm support shaft 147.

A second upper arm rotation shaft 148 is provided inside the second lower arm rotating shaft 145. The second upper arm rotation shaft 148 is attached to the second lower arm rotating shaft 145 so as to be rotatable around the fourth axis L5. A lower end portion of the second upper arm rotation shaft 148 projects downward beyond a lower end of the second lower arm rotating shaft 145, and a second upper arm rotation driven gear 149 is fixed to this projecting portion of the second upper arm rotation shaft 148. The second upper arm rotation driven gear 149 is provided at a position higher than a position at which the upper arm/hand driving main gear 69 of the below-described upper arm/hand driving shaft 66 is provided. The second upper arm rotation driven gear 149 is connected to the upper arm/hand driving main gear 69 through a second reversing gear 70. With this, the rotation of the upper arm/hand driving main gear 69 is transmitted to the second upper arm rotation driven gear 149 through the second reversing gear 70. An upper end portion of the second upper arm rotation shaft 148 is located in the internal space of the second lower arm 141, and a second upper arm rotation intermediate pulley 150 is fixed to this portion of the second upper arm rotation shaft 148. The second upper arm rotation driven gear 149 and the second upper arm rotation intermediate pulley 150 are provided such that axes thereof coincide with the fourth axis L5.

The second lower arm 141 is configured such that the initial posture thereof becomes, for example, a posture shown in FIG. 1 (also see solid lines in FIG. 6). To be specific, the second lower arm 141 extends radially from the turning portion 20.

The second upper arm 142 is, for example, a hollow plate-shaped member and is formed in a substantially strip shape in a plan view. A second upper arm rotation driven pulley 151 having a cylindrical shape is fixed to a bottom surface of a lower arm-side end portion 142*a* of the second upper arm 142 (i.e., one end portion of the second upper arm 142). A third transmission belt 152 winds around the second upper arm rotation intermediate pulley 150 and the second upper arm rotation driven pulley 151. The second upper arm rotation driven pulley 151 is attached to the second upper arm support shaft 147 of the second lower arm 141 so as to be rotatable. The second upper arm 142 attached to the second lower arm 141 as above is configured to be rotatable around the fifth axis L6. A second hand support shaft 153 extending upward is formed at a hand-side end portion 142*b* in the second upper arm 142 (i.e., the other end portion of the second upper arm 142). The second hand support shaft 153 is provided such that an axis thereof coincides with a sixth axis L7 extending parallel to the turning axis L1.

The second upper arm 142 is configured such that the initial posture thereof becomes, for example, a posture shown in FIG. 1 (also see solid lines in FIG. 6). To be specific, the second upper arm 142 extends from the upper arm-side end portion 141*b* of the second lower arm 141 toward the symmetric surface S.

The second hand 143 is, for example, a plate-shaped member, and a second hand rotation shaft 157 is provided at a base end portion of the second hand 143. The second hand rotation shaft 157 is formed in a cylindrical shape and is fitted and attached to the second hand support shaft 153 so as to be rotatable around the sixth axis L7 and located outside the second hand support shaft 153. A second hand pulley 154 is fitted and fixed to an outer periphery of the second hand rotation shaft 157. A fourth transmission belt 156 winds around the second hand pulley 154 and the second fixed pulley 155. As shown in FIG. 2, the second hand 143 is formed in a bifurcated shape and includes the second substrate holding portion 143*a* at a tip end portion thereof. The second substrate holding portion 143*a* is configured to be able to receive and hold the substrate P. As described above, the second substrate holding portion 143*a* is located on the horizontal surface that is the same as the horizontal surface on which the first substrate holding portion 43*a* is located. The second hand 143 attached to the second upper arm 142 as above is configured to be rotatable around the sixth axis L7.

The second hand 143 in the initial posture extends away from the symmetric surface S as it extends from the sixth axis L7 toward a center of the second substrate holding portion 143*a*. With this, the substrate P held by the second substrate holding portion 143*a* can be prevented from interfering with the substrate P held by the first substrate holding portion 43*a* and located on the same horizontal surface. A position of the second substrate holding portion 143*a* of the second hand 143 in the initial posture is a contracted position. The first substrate holding portion 43*a* and the second substrate holding portion 143*a* are positioned such that when the first substrate holding portion 43*a* and the second substrate holding portion 143*a* hold the respective substrates P and are located at the contracted positions, the substrates P held by the first substrate holding portion 43*a* and the second substrate holding portion 143*a* and positioned on the same horizontal surface do not overlap each other or interfere with each other. By the operation of the second hand mechanism 140 described later in detail, the second substrate holding portion 143*a* is movable between the contracted position and an extended position located farther from the turning axis than the contracted position. The extended position is set so as to correspond to each of the substrate placing positions 6 of the semiconductor processing equipment 100.

The second driven mechanism 144 is a mechanism configured to be driven by the rotation of the second upper arm 142 to rotate the second hand 143. In the present embodiment, the second driven mechanism 144 is constituted by, for example, the second hand pulley 154, the second fixed pulley 155, and the fourth transmission belt 156 that winds around the second hand pulley 154 and the second fixed pulley 155. The first fixed pulley 55 is fixed to the second upper arm support shaft 147 such that an axis thereof coincides with the fifth axis L6. Therefore, when the second hand support shaft 153 revolves around the fifth axis L6 by the rotation of the second upper arm 14, the second hand rotation shaft 157 attached to the second hand support shaft 153 so as to be rotatable rotates around the sixth axis L7 in a direction opposite to the rotational direction of the second upper arm 142, and the second hand 143 rotates around the sixth axis L7 in a direction opposite to the rotational direction of the second upper arm 142. Therefore, when the second upper arm 142 rotates such that the hand-side end portion 142*b* of the second upper arm 142 in the initial posture moves forward, the second hand 143 rotates accordingly such that an angle between the second upper arm 142 and the second hand 143 at the sixth axis L7 increases (i.e., the second upper arm 142 and the second hand 143 extend). On the other hand, when the second upper arm 142 rotates such that the hand-side end portion 142*b* of the second upper arm 142 moves rearward, the second hand 143 rotates accordingly such that the angle between the second upper arm 142 and the second hand 143 at the sixth axis L7 decreases (i.e., the second upper arm 142 and the second hand 143 contract).

The second hand 143 rotates in accordance with the rotation of the second upper arm 142 so as to avoid the first hand mechanism 40. In the present embodiment, this operation is realized by adjusting a change gear ratio between the second hand pulley 154 and the second fixed pulley 155, that is, a reduction ratio of the second hand 143 to the second upper arm 142. The reduction ratio is set within a range of not lower than 1.35 and not higher than 1.65. By setting the reduction ratio in such range, the second hand 143 rotates in accordance with the rotation of the second upper arm 142 so as to avoid the first hand mechanism 40. By cooperation with the rotational operation of the second lower arm 141, the first substrate holding portion 43*a* can be moved such that a movement trajectory of the first substrate holding portion 43a becomes a predetermined curved line that practically gets close to a straight line extending radially from the turning axis L1 or a straight line parallel to the above straight line extending radially from the turning axis L1 (details will be described later). In the present embodiment, the reduction ratio is set to 1.57 that is the same as the reduction ratio of the first hand mechanism 40.

Transferring Apparatus Drive Mechanism

Figure 5:
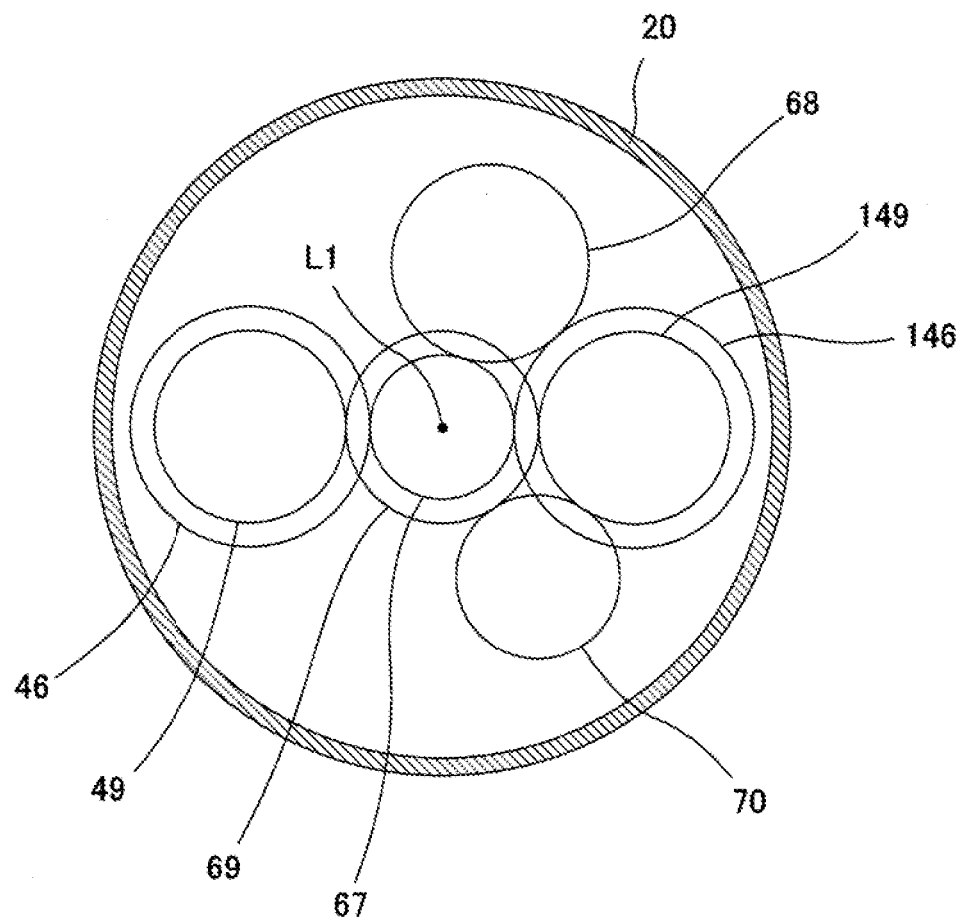
FIG. 5 is a plan view schematically showing gears provided at a turning portion of the substrate transferring apparatus of FIG. 1.

FIG. 5 is a plan view schematically showing gears provided at the turning portion 20.

As shown in FIG. 4, the transferring apparatus drive mechanism 60 includes first to third driving portions 61 to 63 supported by the supporting body (not shown).

Figure 19:
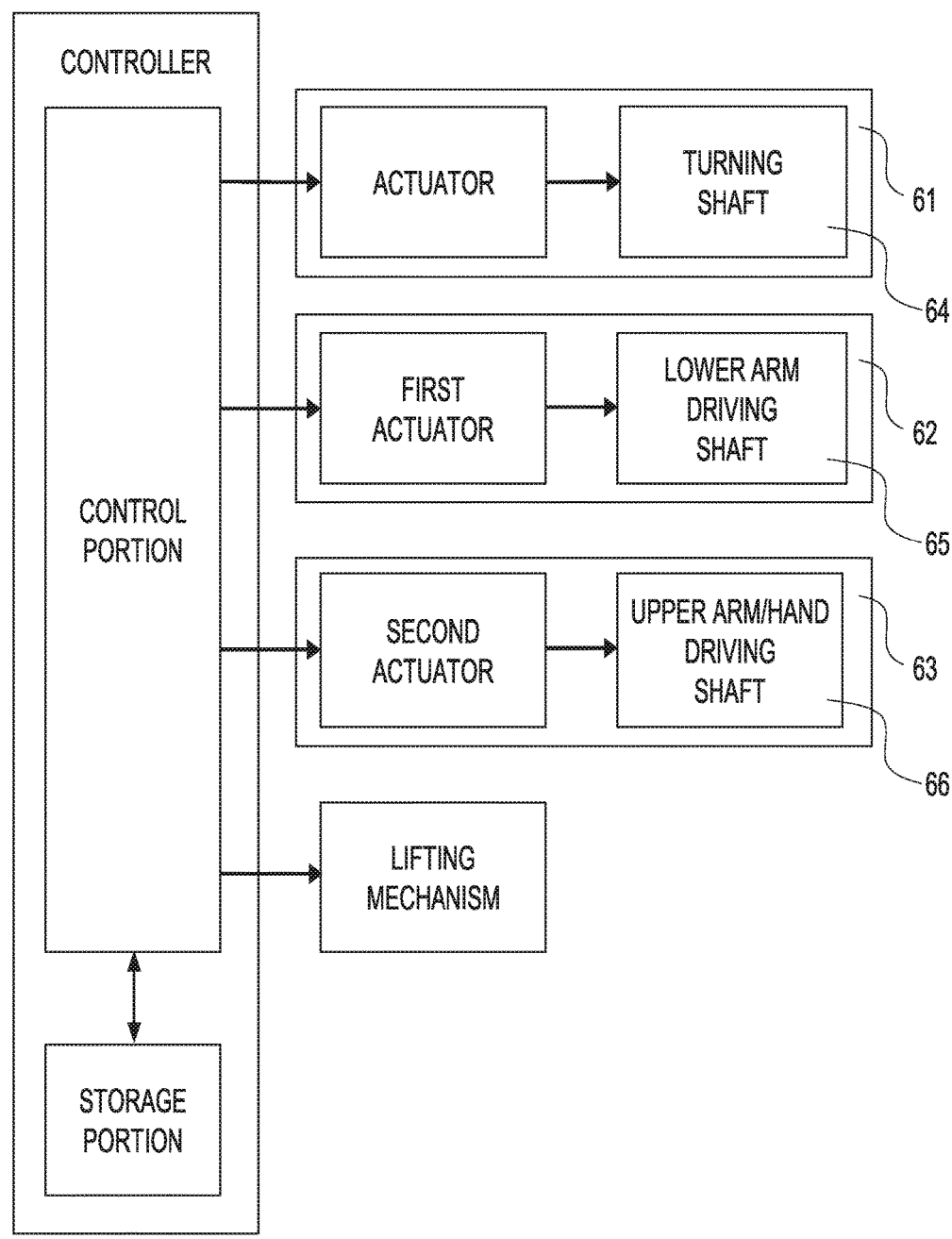
FIG. 19 is a schematic relating to the substrate transferring apparatus according to an embodiment.

As shown in FIG. 19, the first driving portion 61 includes the turning shaft 64 and an actuator configured to rotate the turning shaft 64.

As shown in FIG. 3, the turning shaft 64 is provided so as to be rotatable around the turning axis L1. The turning shaft 64 is formed in a hollow cylindrical shape. As described above, the upper end of the turning shaft 64 is fixed to the turning portion 20, and the turning shaft 64 is configured to rotate together with the turning portion 20. As above, the turning portion 20 and the first and second hand mechanisms 40 and 140 supported by the turning portion 20 turn by the operation of the first driving portion 61.

As shown in FIG. 19, the second driving portion 62 includes the lower arm driving shaft 65 and an actuator configured to rotate the lower arm driving shaft 65.

As shown in FIGS. 3 and 4, the lower arm driving shaft 65 is inserted through the turning shaft 64 and is provided so as to be rotatable around the turning axis L1. The lower arm driving shaft 65 is formed in a round rod shape. An upper end of the lower arm driving shaft 65 projects upward from the turning shaft 64 and the below-described upper arm/hand driving shaft 66. The lower arm rotation main gear 67 is provided at the upper end of the lower arm driving shaft 65. As described above, as also shown in FIG. 5, the lower arm rotation main gear 67 meshes with the first lower arm rotation driven gear 46. The lower arm rotation main gear 67 meshes with the second lower arm rotation driven gear 146 through the first reversing gear 68.

Since the second lower arm rotation driven gear 146 meshes with the lower arm rotation main gear 67 through the first reversing gear 68 as above, the second lower arm rotation driven gear 146 rotates by the rotation of the lower arm driving shaft 65 in a direction opposite to a direction in which the first lower arm rotation driven gear 46 rotates. By the operation of the second driving portion 62, the first lower arm 41 and the second lower arm 141 rotate in sync with each other around the first axis L2 and the fourth axis L5, respectively.

The third driving portion 63 includes the upper arm/hand driving shaft 66 and an actuator (not shown) configured to rotate the upper arm/hand driving shaft 66.

The upper arm/hand driving shaft 66 is inserted through the turning shaft 64 and is provided so as to be rotatable around the turning axis L1. The upper arm/hand driving shaft 66 is formed in a hollow cylindrical shape, and the lower arm driving shaft 65 is inserted through the upper arm/hand driving shaft 66. To be specific, the lower arm driving shaft 65 and the upper arm/hand driving shaft 66 are provided in the turning shaft 64 in a nested manner. An upper end of the upper arm/hand driving shaft 66 projects upward from the turning shaft 64 and is located lower than the upper end of the lower arm driving shaft 65. The upper arm/hand driving main gear 69 is provided at the upper end of the upper arm/hand driving shaft 66. As described above, as also shown in FIG. 5, the upper arm/hand driving main gear 69 meshes with the first upper arm rotation driven gear 49. The upper arm/hand driving main gear 69 meshes with the second upper arm rotation driven gear 149 through the second reversing gear 70.

As above, the second upper arm rotation driven gear 149 meshes with the upper arm/hand driving main gear 69 through the second reversing gear 70. Therefore, by the rotation of the upper arm/hand driving shaft 66, the second upper arm rotation driven gear 149 rotates in a direction opposite to a direction in which the first upper arm rotation driven gear 49 rotates.

The first upper arm rotation shaft 48 and the second upper arm rotation shaft 148 rotate by the rotation of the first upper arm rotation driven gear 49 and the rotation of the second upper arm rotation driven gear 149. Further, the first upper arm rotation intermediate pulley 50 and the second upper arm rotation intermediate pulley 150 rotate by the rotation of the first upper arm rotation shaft 48 and the rotation of the second upper arm rotation shaft 148. Furthermore, the first upper arm rotation driven pulley 51 and the second upper arm rotation driven pulley 151 rotate by the rotation of the first upper arm rotation intermediate pulley 50 and the rotation of the second upper arm rotation intermediate pulley 150 through the first transmission belt 52 and the third transmission belt 152. As a result, the first upper arm 42 and the second upper arm 142 rotate. To be specific, by the operation of the third driving portion 63, the first upper arm 42 and the second upper arm 142 rotate in sync with each other around the second axis L3 and the fifth axis L6, respectively.

In accordance with the rotation of the first upper arm 42 around the second axis L3 and the rotation of the second upper arm 142 around the fifth axis L6, the first hand 43 and the second hand 143 are rotated in sync with each other by the first driven mechanism 44 and the second driven mechanism 144. With this, by the first hand mechanism 40 and the second hand mechanism 140, the substrate transferring apparatus 1 can transfer two substrates P to the respective substrate placing positions at the same time and can take out two substrates P from the respective substrate placing positions at the same time (details will be described later).

As above, since the substrate transferring apparatus 1 is driven by three driving portions that are the first driving portion 61, the second driving portion 62, and the third driving portion 63, the configuration of the substrate transferring apparatus 1 can be simplified, and this is advantageous in manufacture and makes the manufacturing cost low.

Lifting Mechanism

In the present embodiment, the substrate transferring apparatus 1 includes a lifting mechanism (not shown). The lifting mechanism includes, for example, a known ball screw mechanism and an actuator configured to drive the ball screw mechanism. For example, the lifting mechanism integrally lifts up and down the turning portion 20, the first hand mechanism 40, and the second hand mechanism 140. With this, the lifting mechanism can lift up and down the first substrate holding portion 43a and the second substrate holding portion 143a between a lifted-up position and a lifted-down position. The lifted-down position is set to be lower in height than the position of the substrate supporting portion provided at the substrate placing position 6. Further, the lifted-up position is set to be higher in height than the position of the substrate supporting portion provided at the substrate placing position 6. Therefore, by lifting up the first substrate holding portion 43a and the second substrate holding portion 143a from the lifted-down position to the lifted-up position at the substrate placing positions 6, the substrates P placed at the substrate supporting portions can be lifted up and can be held by the first substrate holding portion 43a and the second substrate holding portion 143a. Further, by lifting down the first substrate holding portion 43a and the second substrate holding portion 143a from the lifted-up position to the lifted-down position at the substrate placing positions 6, the substrates P held by the first substrate holding portion 43a and the second substrate holding portion 143a can be placed on the substrate supporting portions of the substrate placing positions 6.

Control Portion

The controller included in the substrate transferring apparatus 1 includes: a control portion having a calculation unit such as a CPU; and a storage portion having a memory such as a ROM or a RAM. The control portion may be constituted by a single control unit configured to perform centralized control or may be constituted by a plurality of control units which cooperate to perform distributed control. The control portion controls the operations of the actuators of the first to third driving portions 61 to 63 and the operation of the actuator of the lifting mechanism to control the operation of the substrate transferring apparatus 1. The storage portion stores predetermined control programs. The control portion reads out and executes these control programs to control the operation of the substrate transferring apparatus 1.

Examples of Operations of First and Second Hand Mechanisms

Next, examples of the operation of the substrate transferring apparatus 1 will be explained.

FIG. 6 is a plan view showing the operations of the first and second hand mechanisms 40 and 140.

Extending Operation

First, the following will explain an extending operation of moving the first substrate holding portion 43a and the second substrate holding portion 143a from the contracted positions to the extended positions.

First, the control portion drives the actuator of the second driving portion 62 and the actuator of the third driving portion 63 such that: a movement trajectory of the first substrate holding portion 43a becomes a predetermined curved line (hereinafter simply referred to as a "predetermined close curved line") that practically gets close to a straight line La extending radially from the turning axis L1 or a straight line parallel to the straight line La; and a movement trajectory of the second substrate holding portion 143a becomes a predetermined curved line (hereinafter simply referred to as a "predetermined close curved line") that practically gets close to a straight line Lb extending radially from the turning axis L1 or a straight line parallel to the straight line Lb. Each of the straight line extending radially from the turning axis L1 and the straight line parallel to the above straight line extending radially from the turning axis L1 is a line passing through the substrate placing position 6 of the chamber 2. Therefore, the predetermined close curved lines are predetermined depending on the respective substrate placing positions.

In the present embodiment, the storage portion prestores operation setting data for operating the second driving portion 62 and the third driving portion 63 such that the movement trajectory of the first substrate holding portion 43a and the movement trajectory of the second substrate holding portion 143a become the respective predetermined close curved lines. The control portion controls the actuator of the second driving portion 62 and the actuator of the third driving portion 63 based on the operation setting data.

With this, the first substrate holding portion 43a and the second substrate holding portion 143a at the contracted positions move to the corresponding extended positions.

The control portion drives the second driving portion 62 and the third driving portion 63 such that the movement trajectory of the first substrate holding portion 43a and the movement trajectory of the second substrate holding portion 143a become the respective predetermined close curved lines. Therefore, in the vicinity of the extended position, each of the first substrate holding portion 43a and the second substrate holding portion 143a moves so as to draw a substantially straight line. With this, although details will be described later, the substrate P held by the first substrate holding portion 43a and the substrate P held by the second substrate holding portion 143a can be prevented from interfering with the gates 4 during the transfer.

Contracting Operation

Next, the following will explain a contracting operation of moving the first substrate holding portion 43a and the second substrate holding portion 143a from the extended positions to the contracted positions.

First, the control portion drives the actuator of the second driving portion 62 and the actuator of the third driving portion 63 such that the first substrate holding portion 43a and the second substrate holding portion 143a draw the respective predetermined close curved lines drawn at the time of the extending operation. In the present embodiment, as with the case at the time of the extending operation, the storage portion prestores data for operating the second driving portion 62 and the third driving portion 63 such that the movement trajectory of the first substrate holding portion 43a and the movement trajectory of the second substrate holding portion 143a become the respective predetermined close curved lines. The control portion controls the actuator of the second driving portion 62 and the actuator of the third driving portion 63 based on this data.

With this, the first substrate holding portion 43a and the second substrate holding portion 143a at the extended positions move to the corresponding contracted positions.

The control portion drives the actuator of the second driving portion 62 and the actuator of the third driving portion 63 such that the movement trajectory of the first substrate holding portion 43a and the movement trajectory of the second substrate holding portion 143a become respective predetermined close curved lines that are the same as the predetermined close curved lines drawn at the time of the extending operation. Therefore, in the vicinity of the extended position, each of the first substrate holding portion 43a and the second substrate holding portion 143a moves so as to draw a substantially straight line. With this, although details will be described later, the substrate P held by the first substrate holding portion 43a and the substrate P held by the second substrate holding portion 143a can be prevented from interfering with the gates 4 during the transfer.

In each of the extending operation and the contracting operation, the control portion drives the actuator of the second driving portion 62 and the actuator of the third driving portion 63 such that: the substrate P held by the first substrate holding portion 43a is moved in a region which is located at one side of the symmetric surface S and in which the first hand mechanism 40 is located; and the substrate P held by the second substrate holding portion 143a is moved in a region which is located at the other side of the symmetric surface S and in which the second hand mechanism 140 is located. With this, the substrate held by the first substrate holding portion 43a and the substrate held by the second substrate holding portion 143a can be prevented from interfering with each other.

In the foregoing, the control portion drives the actuator of the second driving portion 62 and the actuator of the third driving portion 63 based on the data prestored in the storage portion such that the movement trajectory of the first substrate holding portion 43a and the movement trajectory of the second substrate holding portion 143a become the respective predetermined close curved lines. Instead of this, the control portion may drive one of the second and third driving portions 62 and 63 and drive the other in accordance with the driving of the one of the second and third driving portions 62 and 63 such that the movement trajectory of the first substrate holding portion 43a and the movement trajectory of the second substrate holding portion 143a become the respective predetermined close curved lines.

Examples of Operation of Semiconductor Processing Equipment

Next, examples of the operation of the semiconductor processing equipment 100 will be explained.

First, a case where the substrates P are transferred to the substrate placing positions 6A and 6B in the chambers 2A and 2B will be explained in reference to FIGS. 1 and 7 to 9.

First, the control portion causes the lifting mechanism to position the first substrate holding portion 43a holding the substrate P and the second substrate holding portion 143a holding the substrate P at the lifted-up positions.

Next, the control portion rotates the turning shaft 64 to turn the turning portion 20 of the substrate transferring apparatus 1 in the initial posture. Thus, the first substrate holding portion 43a of the first hand mechanism 40 is positioned so as to face the chamber 2A that is a transfer destination, and the second substrate holding portion 143a of the second hand mechanism 140 is positioned so as to face the chamber 2B that is a transfer destination (see FIG. 1).

Next, the control portion rotates the lower arm driving shaft 65 and the upper arm/hand driving shaft 66 to extend the first substrate holding portion 43a at the contracted position toward the extended position corresponding to the substrate placing position 6A and extend the second substrate holding portion 143a at the contracted position toward the extended position corresponding to the substrate placing position 6B. At this time, the control portion controls the rotation of the lower arm driving shaft 65 and the rotation of the upper arm/hand driving shaft 66 such that the movement trajectory of the first substrate holding portion 43a becomes the predetermined close curved line corresponding to the substrate placing position 6A and the movement trajectory of the second substrate holding portion 143a becomes the predetermined close curved line corresponding to the substrate placing position 6B, and thus, the first substrate holding portion 43a and the second substrate holding portion 143a are moved from the contracted positions to the extended positions. Therefore, when the substrate P held by the first substrate holding portion 43a and the substrate P held by the second substrate holding portion 143a get close to the gates 4A and 4B, respectively (see FIG. 7), the first substrate holding portion 43a is substantially linearly inserted through the vicinity of a center of the gate 4A so as not to contact the gate 4A, and the second substrate holding portion 143a is substantially linearly inserted through the vicinity of a center of the gate 4B so as not to contact the gate 4B.

Even after the above insertion, the control portion extends the first hand mechanism 40 while adjusting a rotation speed of the lower arm driving shaft 65 and a rotation speed of the upper arm/hand driving shaft 66. Thus, the substrate P held by the first substrate holding portion 43a and the substrate P held by the second substrate holding portion 143a are substantially linearly moved toward the substrate placing positions 6A and 6B, respectively (see FIG. 8).

When the substrate P held by the first substrate holding portion 43a reaches the extended position corresponding to the substrate placing position 6A and the substrate P held by the second substrate holding portion 143a reaches the extended position corresponding to the substrate placing position 6B (see FIG. 9), the control portion stops the rotation of the lower arm driving shaft 65 and the rotation of the upper arm/hand driving shaft 66.

Next, the control portion causes the lifting mechanism to lift down the first substrate holding portion 43a and the second substrate holding portion 143a from the lifted-up positions to the lifted-down positions and place the substrates P on the substrate supporting portions of the substrate placing positions 6A and 6B. With this, the two substrates P held by the first substrate holding portion 43a and the second substrate holding portion 143a are transferred to the substrate placing positions 6A and 6B at the same time. After the substrates P are placed, the control portion rotates the lower arm driving shaft 65 and the upper arm/hand driving shaft 66 to contract the first hand mechanism 40 and the second hand mechanism 140. Thus, the first hand 43 is moved back along the above movement trajectory to be returned to the initial posture.

Figure 10:
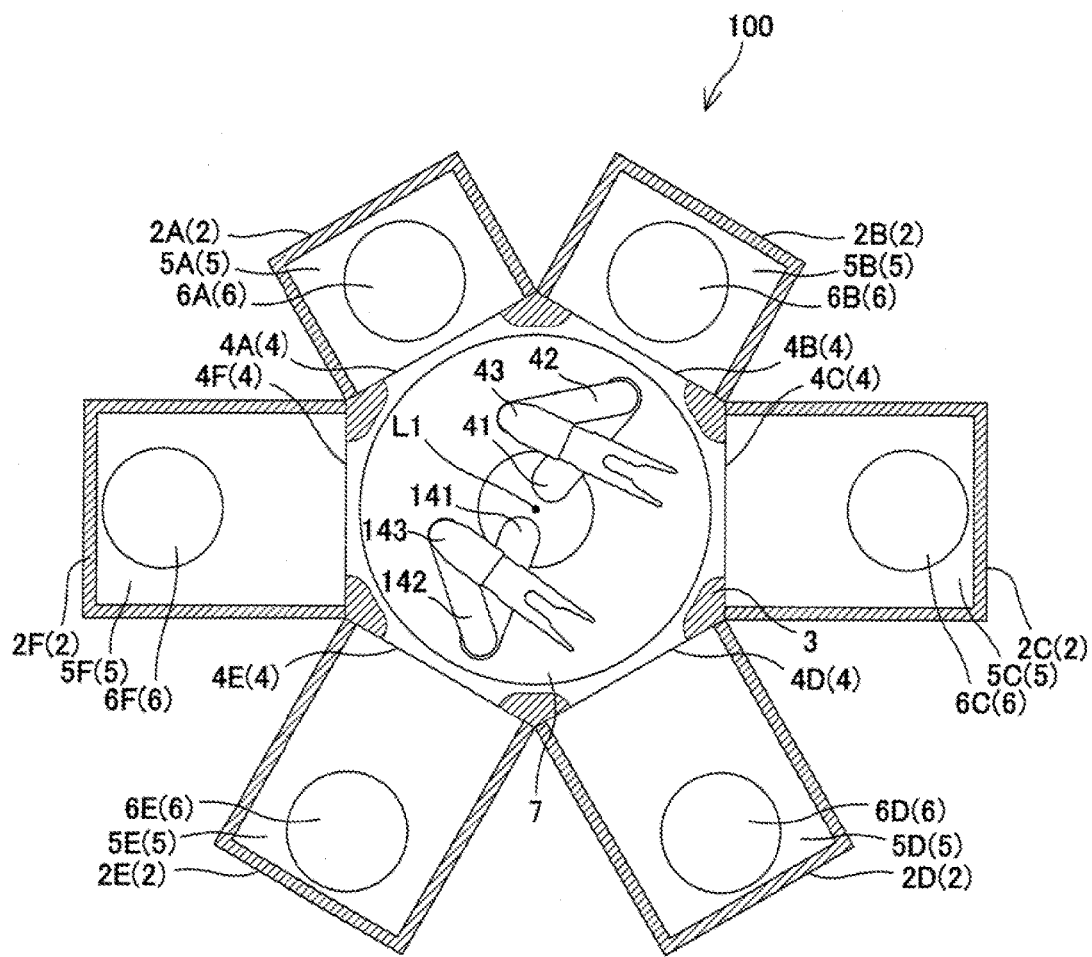
FIG. 10 is a plan view showing the substrate transferring apparatus that turns from the state shown in FIG. 1, so that first and second substrate holding portions face different chambers.
Figure 18:
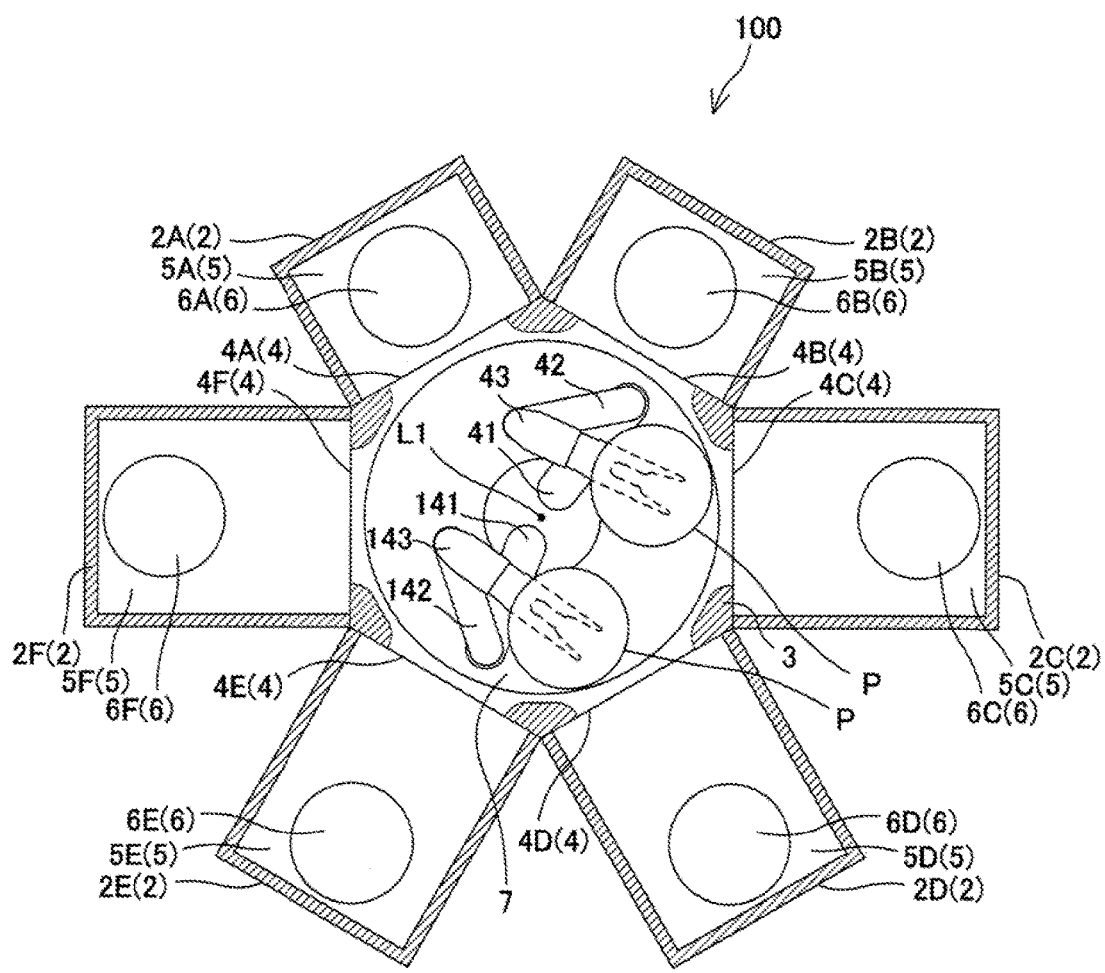
FIG. 18 is a plan view showing the substrate transferring apparatus in which the first and second hand mechanisms are contracted from a state shown in FIG. 17 to return to initial postures.

Next, a case where the substrates P placed on the substrate placing positions 6C and 6D in the chambers 2C and 2D are taken out will be explained in reference to FIGS. 10 and 18.

First, the control portion causes the lifting mechanism to locate the first substrate holding portion 43a and the second substrate holding portion 143a at the lifted-down positions.

Next, the control portion rotates the turning shaft 64 to turn the turning portion 20 of the substrate transferring apparatus 1 in the initial posture. Thus, the first substrate holding portion 43a of the first hand mechanism 40 is positioned so as to face the chamber 2C that is a transfer destination, and the second substrate holding portion 143a of the second hand mechanism 140 is positioned so as to face the chamber 2D that is a transfer destination (see FIG. 10).

Figure 11:
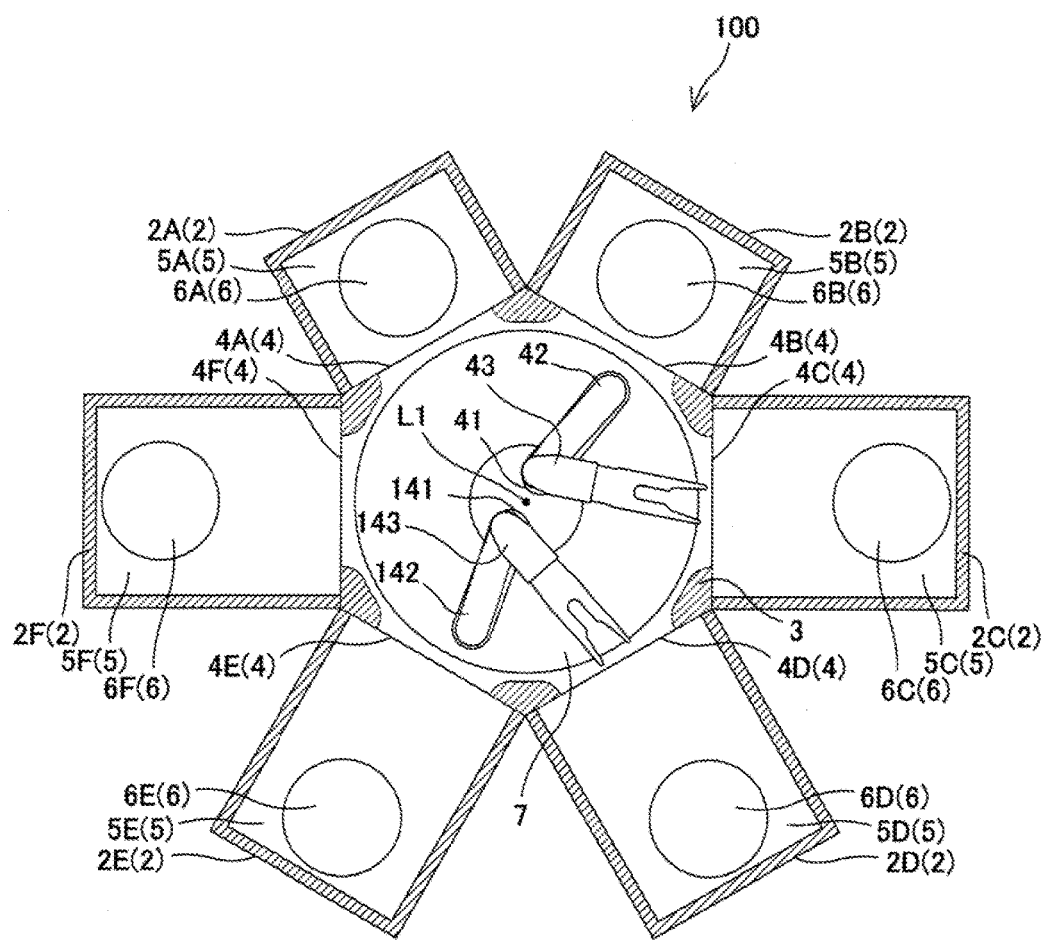
FIG. 11 is a plan view showing the substrate transferring apparatus in which the first and second hand mechanisms are extended from a state shown in FIG. 10, and therefore, the hands get close to the gates.
Figure 12:
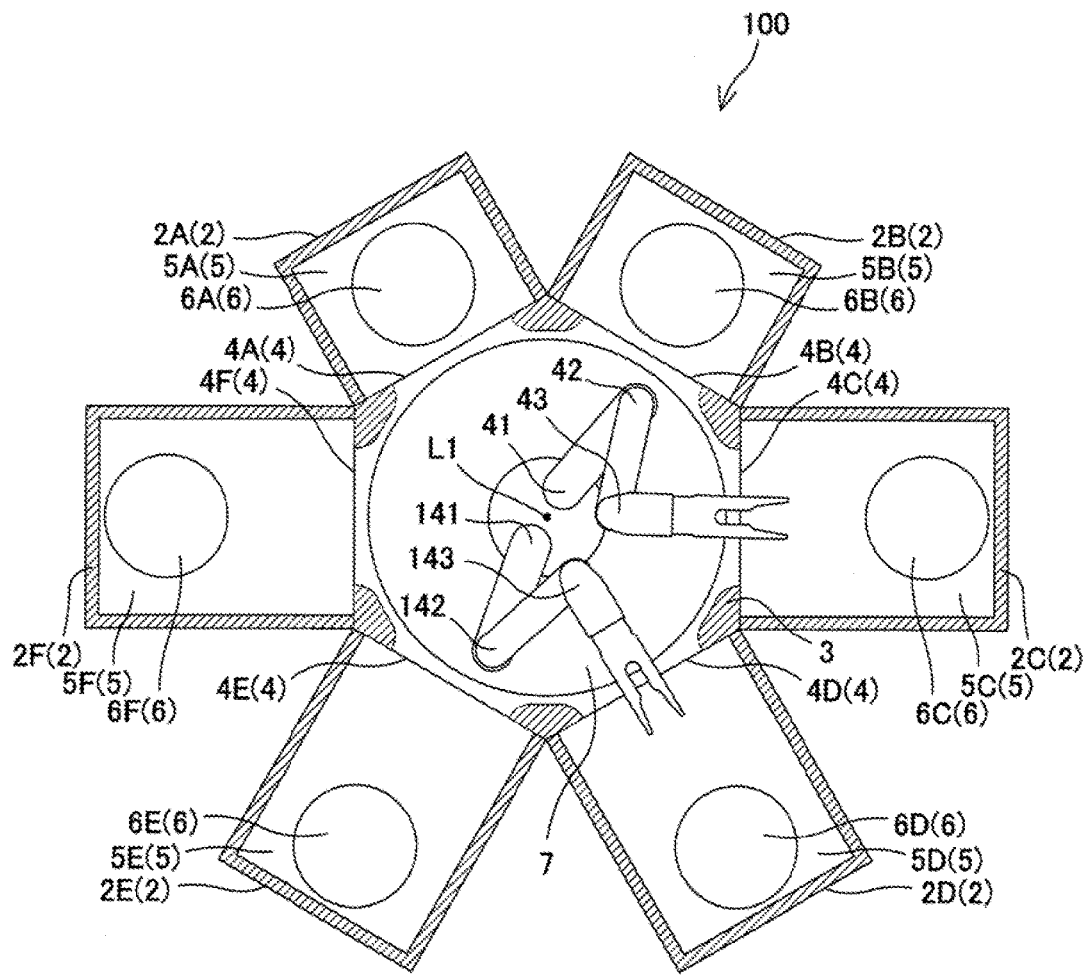
FIG. 12 is a plan view showing the substrate transferring apparatus in which the first and second hand mechanisms are further extended from a state shown in FIG. 11, and therefore, the hands are inserted into the rooms of the chambers.
Figure 13:
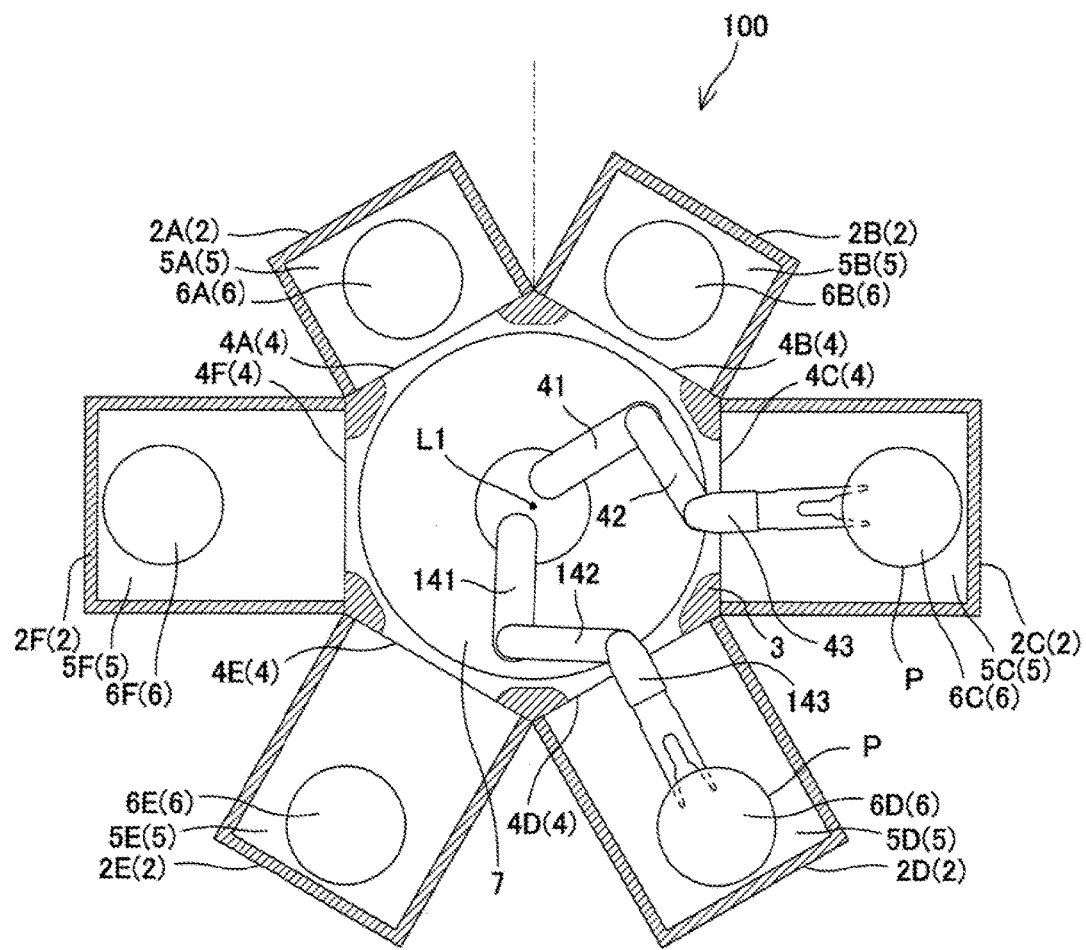
FIG. 13 is a plan view showing the substrate transferring apparatus in which the first and second hand mechanisms are further extended from a state shown in FIG. 12, and therefore, the hands are moved close to the substrate placing positions.

Next, the control portion rotates the lower arm driving shaft 65 and the upper arm/hand driving shaft 66 to extend the first substrate holding portion 43a at the contracted position toward the extended position corresponding to the substrate placing position 6C and extend the second substrate holding portion 143a at the contracted position toward the extended position corresponding to the substrate placing position 6D (see FIGS. 11 to 13). At this time, the control portion controls the rotation of the lower arm driving shaft 65 and the rotation of the upper arm/hand driving shaft 66 such that the movement trajectory of the first substrate holding portion 43a becomes the predetermined close curved line corresponding to the substrate placing position 6C and the movement trajectory of the second substrate holding portion 143a becomes the predetermined close curved line corresponding to the substrate placing position 6D, and thus, the first substrate holding portion 43a is moved from the contracted position to the extended position corresponding to substrate placing position 6C and the second substrate holding portion 143a is moved from the contracted position to the extended position corresponding to the substrate placing position 6D.

Figure 14:
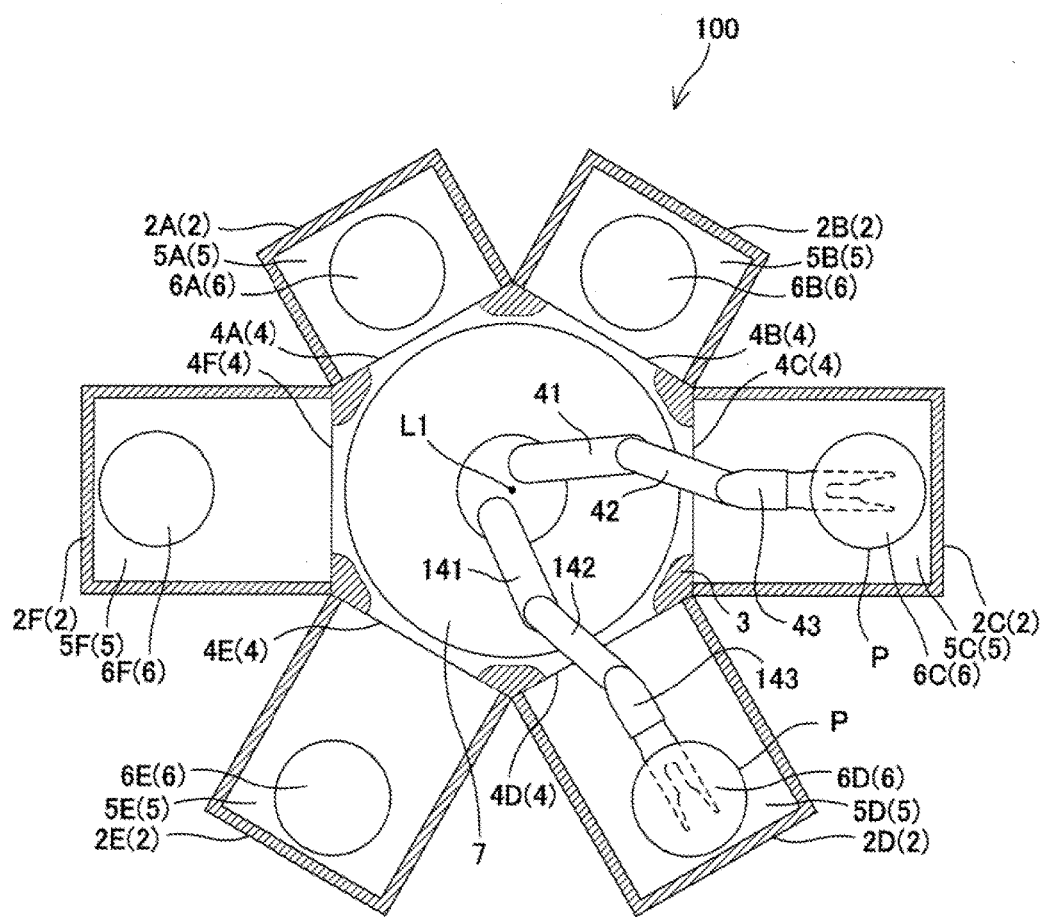
FIG. 14 is a plan view showing the substrate transferring apparatus in which the first and second hand mechanisms are further extended from a state shown in FIG. 13, and therefore, the hands are moved to the substrate placing positions.
Figure 15:
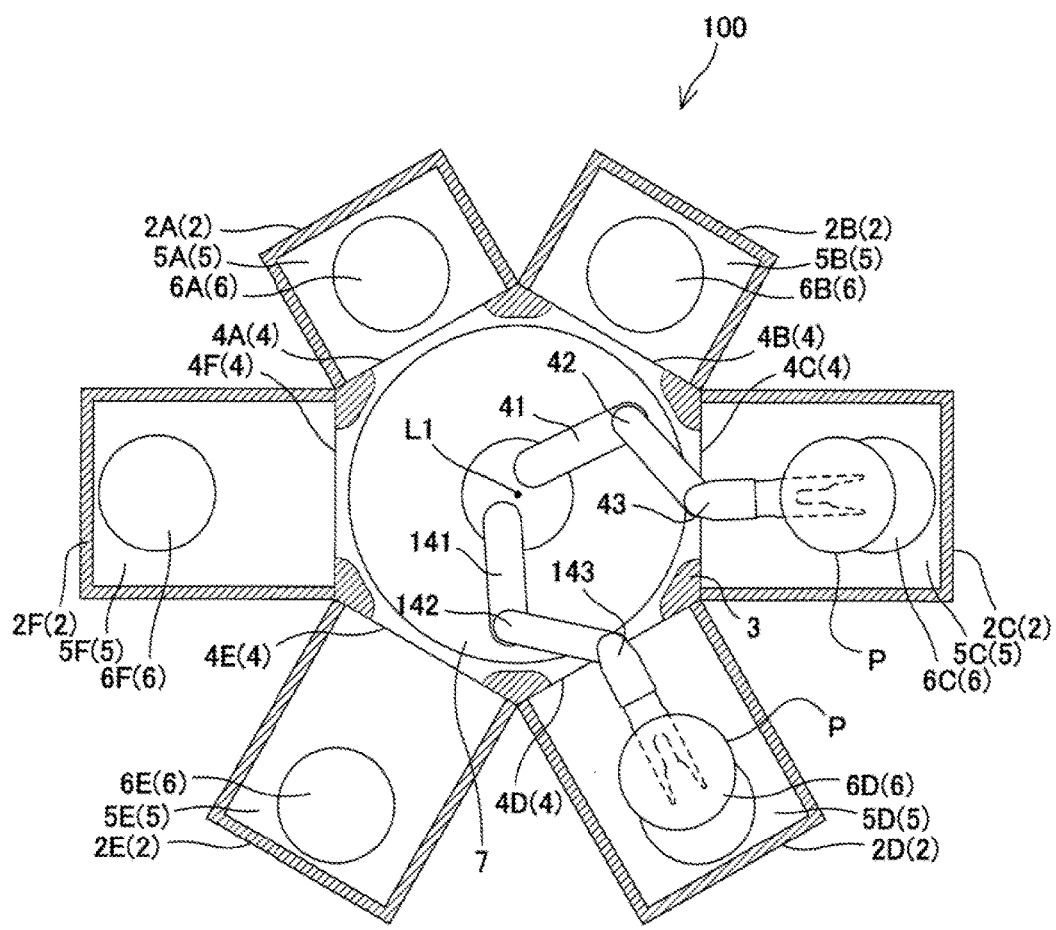
FIG. 15 is a plan view showing the substrate transferring apparatus in which the first and second hand mechanisms are contracted from a state shown in FIG. 14, and therefore, the substrates are taken out from the substrate placing positions.
Figure 16:
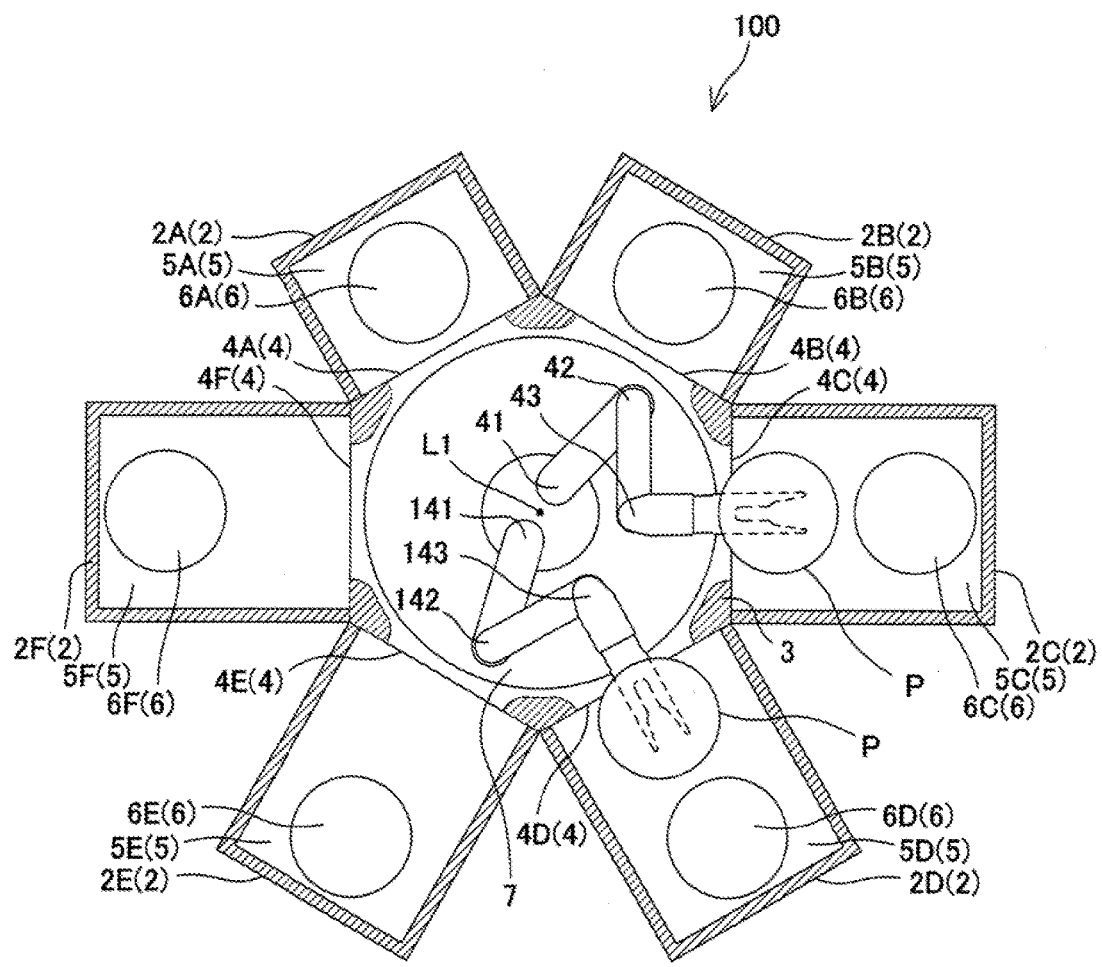
FIG. 16 is a plan view showing the substrate transferring apparatus in which the first and second hand mechanisms are contracted from a state shown in FIG. 15, and therefore, the hands get close to the gates.
Figure 17:
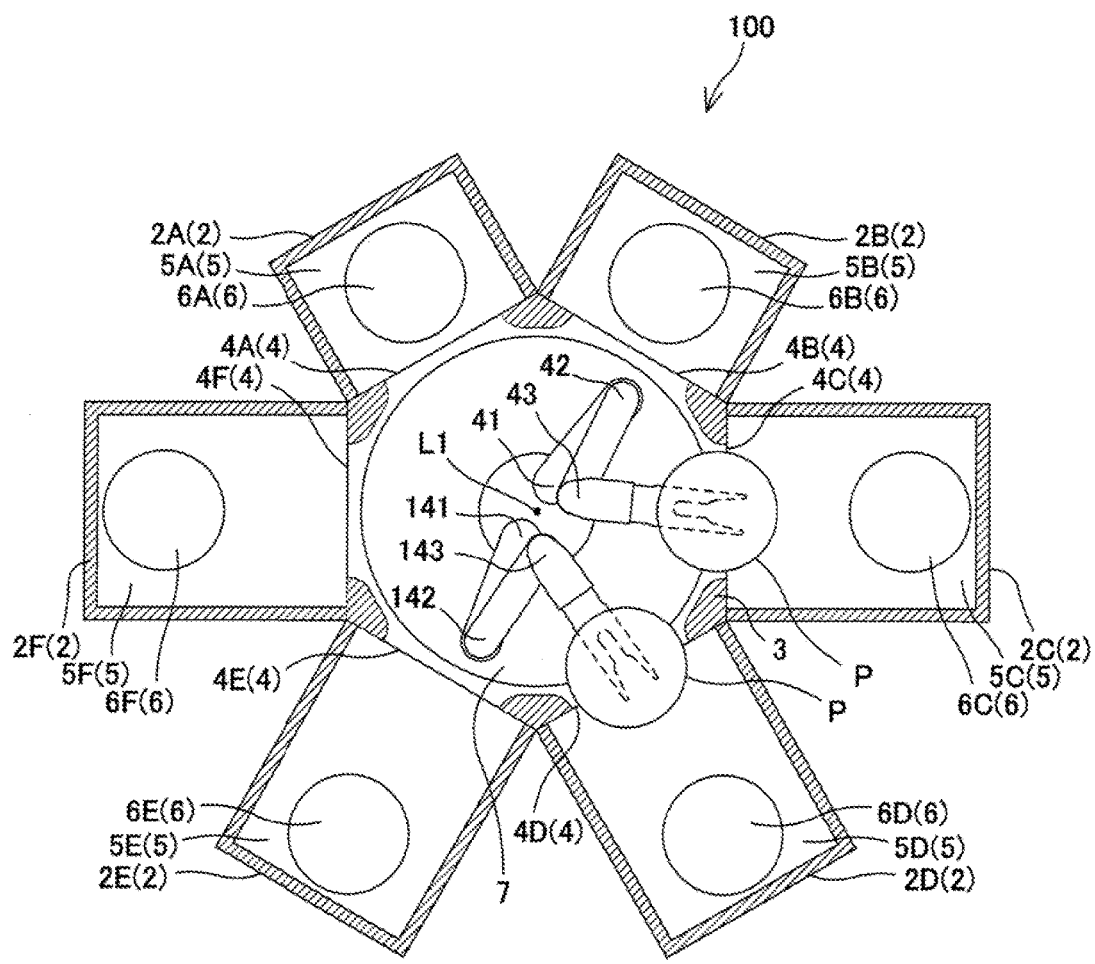
FIG. 17 is a plan view showing the substrate transferring apparatus in which the first and second hand mechanisms are contracted from a state shown in FIG. 16, and therefore, the substrates pass through the gates.

When the first substrate holding portion 43a reaches the extended position corresponding to the substrate placing position 6C and the second substrate holding portion 143a reaches the extended position corresponding to the substrate placing position 6D (see FIG. 14), the control portion stops the rotation of the lower arm driving shaft 65 and the rotation of the upper arm/hand driving shaft 66.

Next, the control portion causes the lifting mechanism to lift up the first substrate holding portion 43a and the second substrate holding portion 143a from the lifted-down positions to the lifted-up positions. Thus, the substrates P placed on the substrate supporting portions are lifted up and held by the first substrate holding portion 43a and the second substrate holding portion 143a. The control portion rotates the lower arm driving shaft 65 and the upper arm/hand driving shaft 66 to contract the first hand mechanism 40 and the second hand mechanism 140. Thus, the first hand 43 is moved back along the above movement trajectory to be returned to the initial posture (see FIGS. 15 to 18). With this, the two substrates P placed on the substrate placing positions 6C and 6D are held by the first substrate holding portion 43a and the second substrate holding portion 143a to be taken out at the same time.

As described above, the substrate transferring apparatus 1 of the present invention can drive the first hand mechanism 40 and the second hand mechanism 140 at the same time to transfer the substrates P to the substrate placing positions 6 of the chambers 2 and take out the substrates P from the substrate placing positions 6 of the chambers 2. Therefore, the substrate transfer efficiency of the substrate transferring apparatus 1 can be improved.

Further, the substrate transferring apparatus 1 of the present invention is applicable to the semiconductor processing equipment 100 in which the processing rooms where the same treatment is performed are provided at one of two virtual regions obtained by dividing the semiconductor processing equipment 100 such that center angles of the two divided regions when viewed from the extending direction of the turning axis L1 are equal to each other.

INDUSTRIAL APPLICABILITY

The present invention is applicable to a transferring apparatus in equipment in which substrates are processed.

REFERENCE SIGNS LIST 1 substrate transferring apparatus
2 chamber
3 transferring chamber
4 gate
5 room
6 substrate placing position
7 transferring room
10 lifting mechanism
20 turning portion
40 first hand mechanism
41 first lower arm
41a turning portion-side end portion (of first lower arm)
41b upper arm-side end portion (of first lower arm)
42 first upper arm
42a lower arm-side end portion (of first upper arm)
42b hand-side end portion (of first upper arm)
43 first hand
43a first substrate holding portion
44 first driven mechanism
45 first lower arm rotating shaft
46 first lower arm rotation driven gear
47 first upper arm support shaft
48 first upper arm rotation shaft
49 first upper arm rotation driven gear
50 first upper arm rotation intermediate pulley
51 first upper arm rotation driven pulley
52 first transmission belt
53 first hand support shaft
54 first hand pulley
55 first fixed pulley
56 second transmission belt
57 first hand rotation shaft
60 transferring apparatus drive mechanism
61 first driving portion
62 second driving portion
63 third driving portion
64 turning shaft
65 lower arm driving shaft
66 upper arm/hand driving shaft
67 lower arm rotation main gear
68 first reversing gear
69 upper arm/hand driving main gear
70 second reversing gear
100 semiconductor processing equipment
140 second hand mechanism
141 second lower arm
141a turning portion-side end portion (of second lower arm)
141b upper arm-side end portion (of second lower arm)
142 second upper arm
142a lower arm-side end portion (of second upper arm)
142b hand-side end portion (of second upper arm)
143 second hand
143a second substrate holding portion
144 second driven mechanism
145 second lower arm rotating shaft
146 second lower arm rotation driven gear
147 second upper arm support shaft
148 second upper arm rotation shaft
149 second upper arm rotation driven gear
150 second upper arm rotation intermediate pulley
151 second upper arm rotation driven pulley
152 third transmission belt
153 second hand support shaft
154 second hand pulley
155 second fixed pulley
156 fourth transmission belt
157 second hand rotation shaft

The invention claimed is:

1. A substrate transferring apparatus comprising:
a turning portion configured to be rotatable around a turning axis;
a first hand mechanism and a second hand mechanism provided at the turning portion so as to be symmetrical with respect to a symmetric surface including the turning axis; and
a transferring apparatus drive mechanism configured to drive the first and second hand mechanisms, wherein:
the first hand mechanism includes
a first lower arm having one end portion attached to the turning portion so as to be rotatable around a first axis parallel to the turning axis,
a first upper arm having one end portion attached to the other end portion of the first lower arm so as to be rotatable around a second axis parallel to the turning axis, a first hand having a tip end portion as a first substrate holding portion and having a base end portion attached to the other end portion of the first upper arm so as to be rotatable around a third axis parallel to the turning axis, the first hand being configured to rotate in accordance with the rotation of the first upper arm, and a first driven mechanism configured to rotate the first hand in accordance with the rotation of the first upper arm;

the first hand mechanism is configured such that the first substrate holding portion is movable by the rotations of the first lower arm, the first upper arm, and the first hand between a contracted position close to the turning axis and an extended position farther from the turning axis than the contracted position;

the second hand mechanism includes a second lower arm having one end portion attached to the turning portion so as to be rotatable around a fourth axis parallel to the turning axis, a second upper arm having one end portion attached to the other end portion of the second lower arm so as to be rotatable around a fifth axis parallel to the turning axis, a second hand having a tip end portion as a second substrate holding portion and having a base end portion attached to the other end portion of the second upper arm so as to be rotatable around a sixth axis parallel to the turning axis, the second hand being configured to rotate in accordance with the rotation of the second upper arm, and a second driven mechanism configured to rotate the second hand in accordance with the rotation of the second upper arm;

the second hand mechanism is configured such that the second substrate holding portion is movable by the rotations of the second lower arm, the second upper arm, and the second hand in sync with the first substrate holding portion between a contracted position close to the turning axis and an extended position farther from the turning axis than the contracted position;

the transferring apparatus drive mechanism includes a first driving portion configured to rotate the turning portion, a second driving portion including a lower arm driving shaft and a first actuator and configured to rotate the first lower arm and the second lower arm in conjunction with each other in directions opposite to each other, the lower arm driving shaft being connected to the first actuator, the first lower arm, and the second lower arm so as to transmit driving force of the first actuator to the first lower arm and the second lower arm, and a third driving portion including an upper arm/hand driving shaft and a second actuator and configured to rotate the first upper arm and the second upper arm in conjunction with each other in directions opposite to each other, the upper arm/hand driving shaft being connected to the second actuator, the first upper arm, and the second upper arm so as to transmit driving force of the second actuator to the first upper arm and the second upper arm; and the second driving portion rotates the first lower arm and the second lower arm, and at the same time, the third driving portion rotates the first upper arm and the second upper arm such that the first and second substrate holding portions move at the same time from the contracted position to the extended position such that a movement trajectory of each of the first and second substrate holding portions becomes a curved line that approaches a straight line extending radially from the turning axis or a straight lire parallel to the straight line extending radially from the turning axis.

2. The substrate transferring apparatus according to claim 1, wherein:

the first substrate holding portion is configured to operate such that a substrate held by the first substrate holding portion is moved in a region located at one side of the symmetric surface; and the second substrate holding portion is configured to operate such that a substrate held by the second substrate holding portion is moved in a region located at the other side of the symmetric surface.

3. The substrate transferring apparatus according to claim 1, wherein:

the first driven mechanism rotates the first hand in accordance with the rotation of the first upper arm at a reduction ratio of not lower than 1.35 and not higher than 1.65; and the second driven mechanism rotates the second hand in accordance with the rotation of the second upper arm at a reduction ratio of not lower than 1.35 and not higher than 1.65.

4. The substrate transferring apparatus according to claim 1, wherein:

the first hand at the contracted position takes such a posture as to get away from the symmetric surface as the first hand extends from the third axis toward a center of the first substrate holding portion; and the second hand at the contracted position takes such a posture as to get away from the symmetric surface as the second hand extends from the sixth axis toward a center of the second substrate holding portion.

5. The substrate transferring apparatus according to claim 1, wherein:

the second driving portion includes a first reversing mechanism connected to the lower arm driving shaft and also connected to one lower arm out of the first lower arm and the second lower arm, the first reversing mechanism being configured to set a rotational direction of rotational driving force, transmitted from the lower arm driving shaft to the one lower arm, to a direction opposite to a rotational direction of rotational driving force transmitted from the lower arm driving shaft to the other lower arm out of the first lower arm and the second lower arm; and the third driving portion includes a second reversing mechanism connected to the upper arm/hand driving shaft and also connected to one upper arm out of the first upper arm and the second upper arm, the second reversing mechanism being configured to set a rotational direction of rotational driving force, transmitted from the upper arm/hand driving shaft to the one upper arm, to a direction opposite to a rotational direction of rotational driving force transmitted from the upper arm/hand driving shaft to the other upper arm out of the first upper arm and the second upper arm.

6. The substrate transferring apparatus according to claim 5, wherein:

the first reversing mechanism is a first reversing gear; and the second reversing mechanism is a second reversing gear.

7. The substrate transferring apparatus according to claim 1, wherein the first driving portion stops the turning portion when the second driving portion rotates the first lower arm and the second lower arm, and at the same time, the third driving portion rotates the first upper arm and the second upper arm such that the first and second substrate holding portions move at the same time from the contracted position to the extended position such that the movement trajectory of each of the first and second substrate holding portions becomes the curved line that approaches the straight line extending radially from the turning axis or the straight line parallel to the straight line extending radially from the turning axis.

* * * * *